(12) United States Patent
Ha et al.

(10) Patent No.: US 7,923,810 B2
(45) Date of Patent: Apr. 12, 2011

(54) SEMICONDUCTOR DEVICES HAVING ACTIVE ELEMENTS WITH RAISED SEMICONDUCTOR PATTERNS AND RELATED METHODS OF FABRICATING THE SAME

(75) Inventors: Dae-Won Ha, Seoul (KR); Sang-Yoon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 224 days.

(21) Appl. No.: 12/288,280

(22) Filed: Oct. 17, 2008

(65) Prior Publication Data
US 2009/0102012 A1 Apr. 23, 2009

(30) Foreign Application Priority Data
Oct. 18, 2007 (KR) .................. 10-2007-0105211

(51) Int. Cl.
*H01L 21/70* (2006.01)
(52) U.S. Cl. .............. 257/511; 257/517; 257/E27.053; 438/758
(58) Field of Classification Search .............. 257/511, 257/517, E27.053; 438/758
See application file for complete search history.

(56) References Cited

U.S. PATENT DOCUMENTS

| 6,171,905 B1 | 1/2001 | Morita et al. |
| 6,965,150 B2 | 11/2005 | Higashida et al. |
| 2002/0031916 A1 * | 3/2002 | Ohkubo et al. ............ 438/758 |
| 2006/0284237 A1 | 12/2006 | Park et al. |

FOREIGN PATENT DOCUMENTS

| JP | 10-189888 | 7/1998 |
| JP | 2001-326354 | 11/2001 |
| JP | 2007-005785 | 1/2007 |
| KR | 1020010065328 A | 7/2001 |
| KR | 1020060133394 A | 12/2006 |

* cited by examiner

*Primary Examiner* — Wael M Fahmy
*Assistant Examiner* — John C Ingham
(74) *Attorney, Agent, or Firm* — Myers Bigel Sibley & Sajovec, P.A.

(57) ABSTRACT

A semiconductor device may include a semiconductor region of a semiconductor substrate wherein a P-N junction is defined between the semiconductor region and a bulk of the semiconductor substrate. An insulating isolation structure in the semiconductor substrate may surround sidewalls of the semiconductor region. An interlayer insulating layer may be on the semiconductor substrate, on the semiconductor region, and on the insulating isolation structure, and the interlayer insulating layer may have first and second spaced apart element holes exposing respective first and second portions of the semiconductor region. A first semiconductor pattern may be in the first element hole on the first exposed portion of the semiconductor region, and a second semiconductor pattern may be in the second element hole on the second exposed portion of the semiconductor region. A surface portion of the first semiconductor pattern opposite the semiconductor substrate and a surface portion of the second semiconductor pattern opposite the semiconductor substrate may have a same conductivity type. Related methods are also discussed.

20 Claims, 11 Drawing Sheets

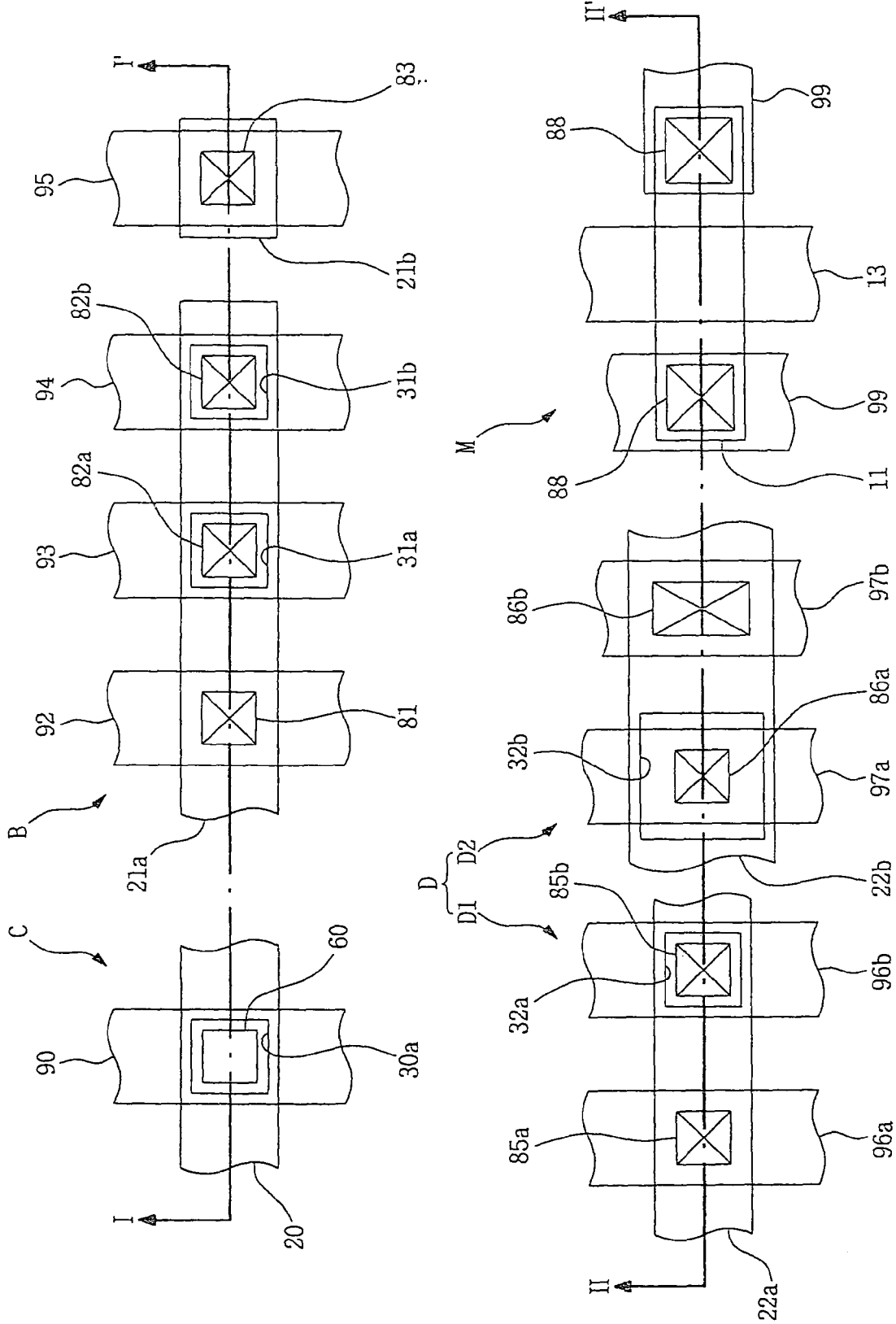

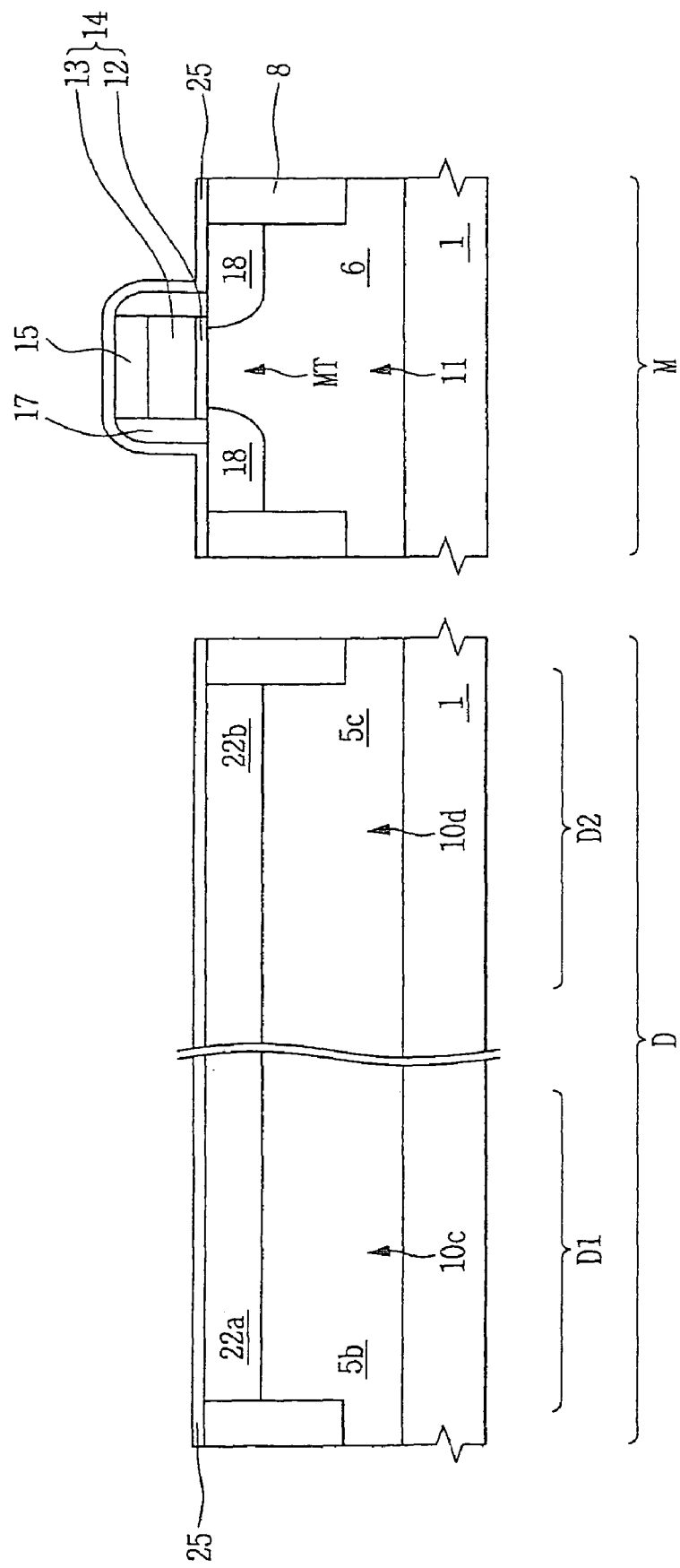

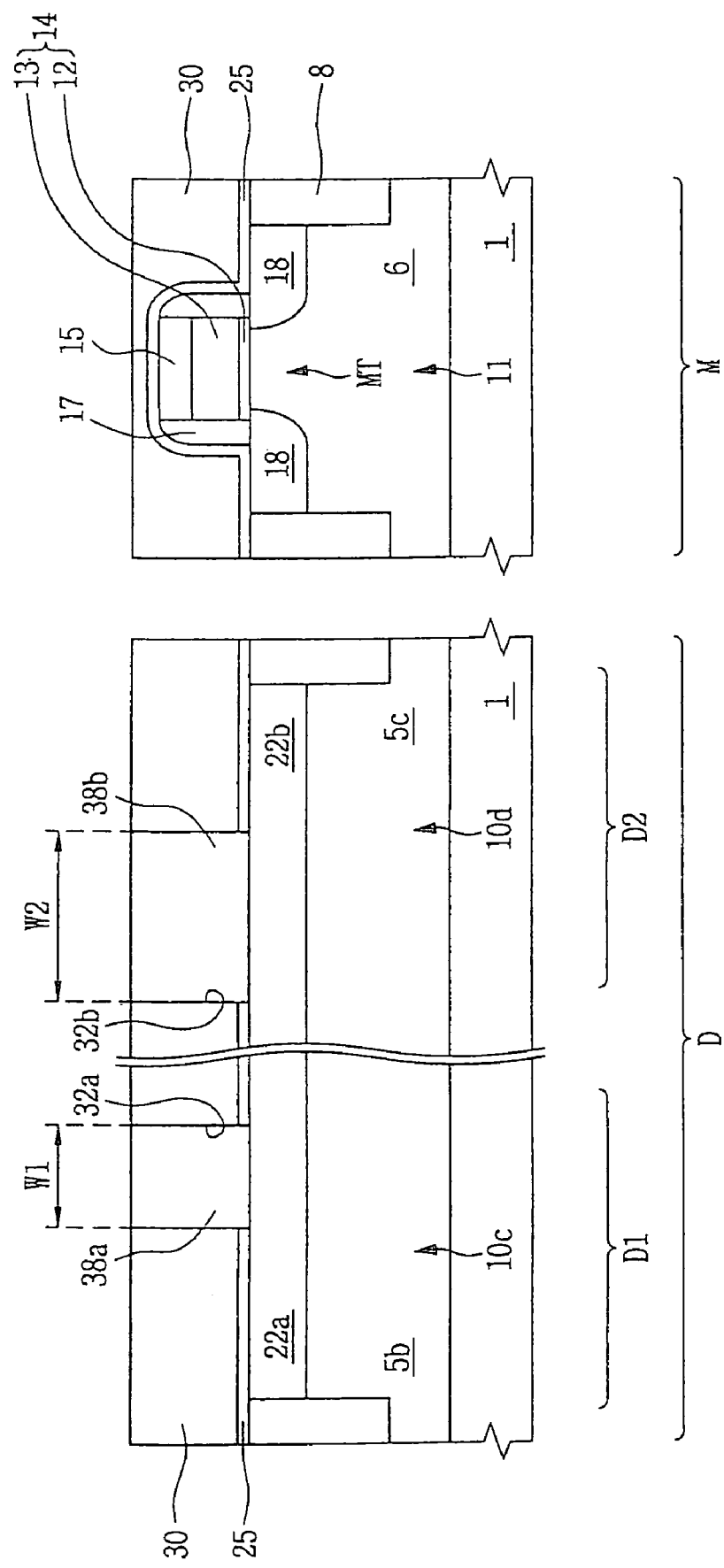

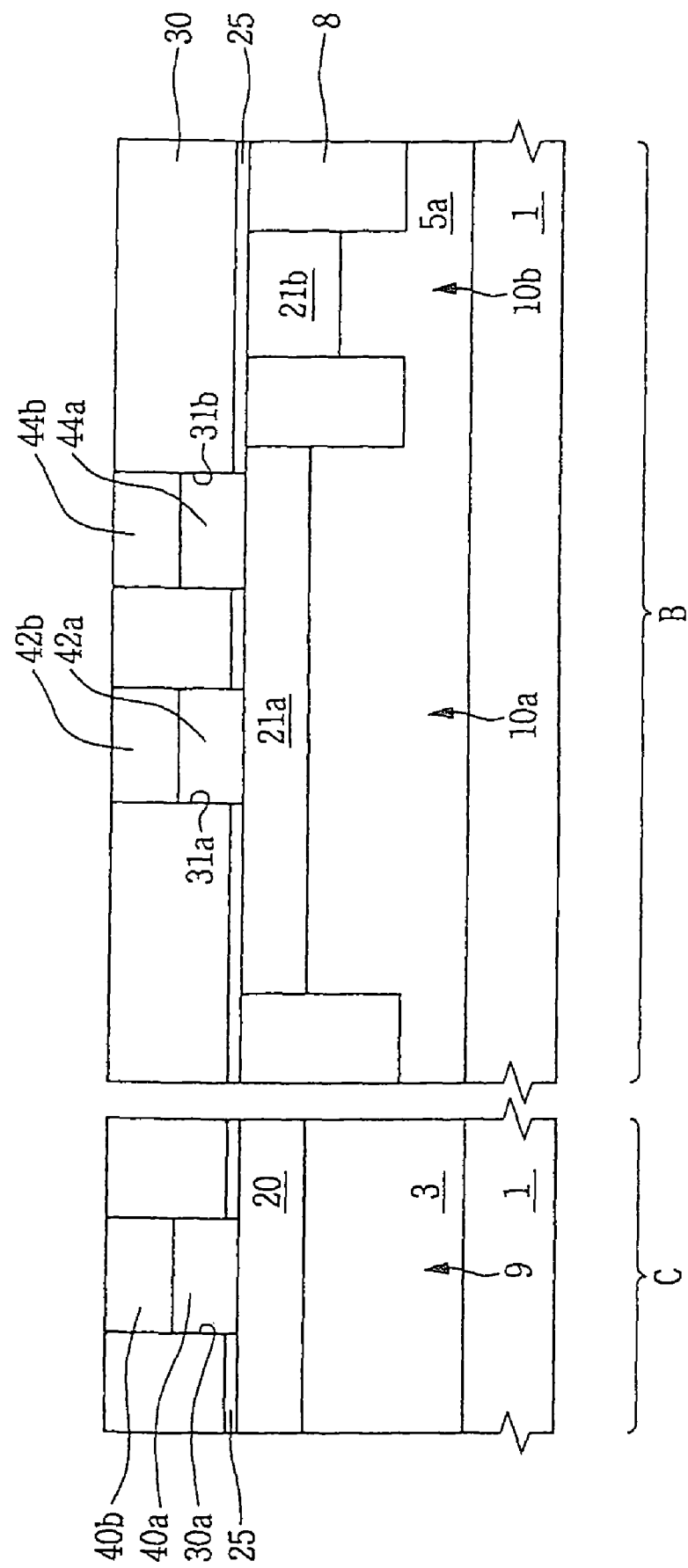

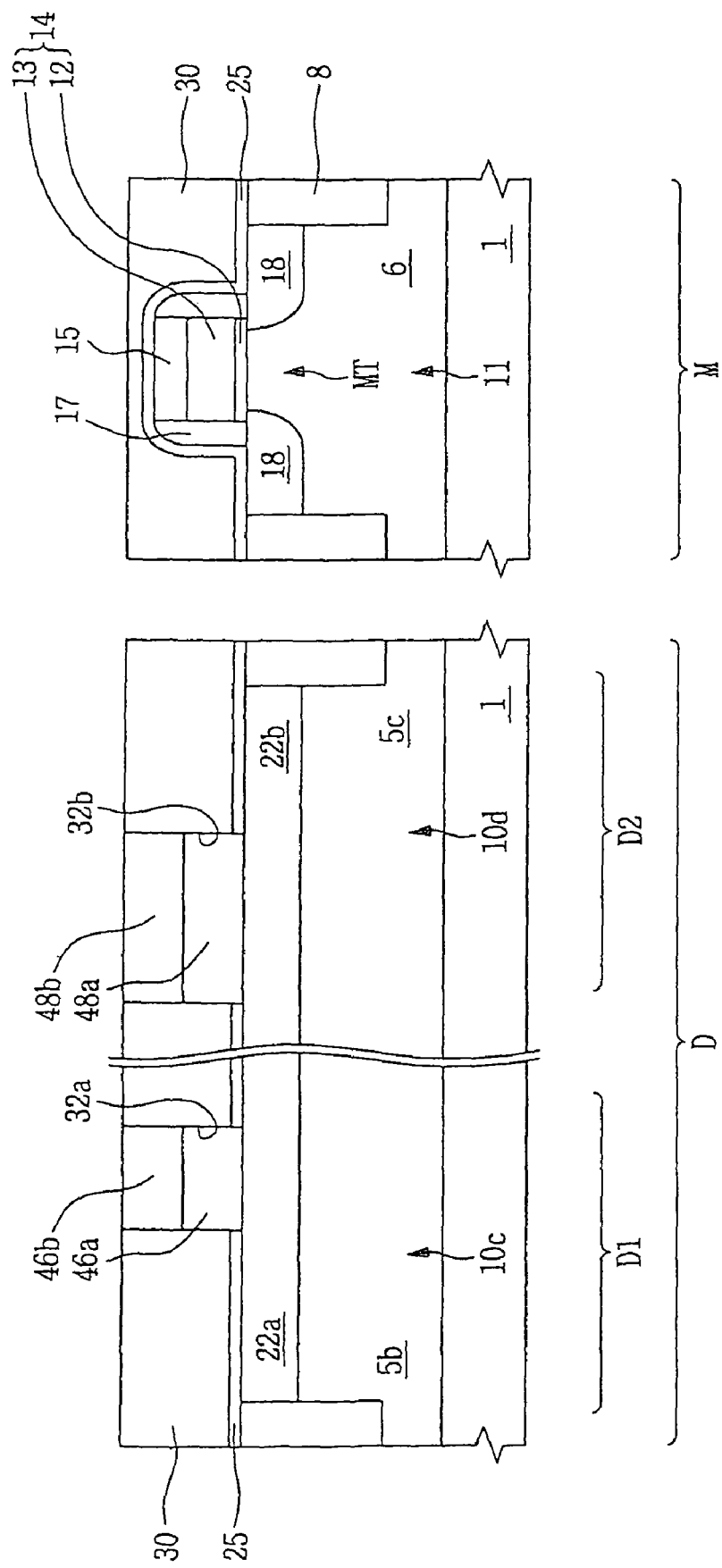

SEMICONDUCTOR DEVICES HAVING ACTIVE ELEMENTS WITH RAISED SEMICONDUCTOR PATTERNS AND RELATED METHODS OF FABRICATING THE SAME

RELATED APPLICATION

This application claims the benefit of priority from Korean Patent Application No. 10-2007-0105211, filed on Oct. 18, 2007, the disclosure of which is hereby incorporated herein by reference in its entirety.

BACKGROUND

1. Field of the Invention

The present invention relates to electronics, and more particularly, to semiconductor devices and methods of fabricating the same.

2. Description of the Related Art

In general, a semiconductor memory device includes a cell array region composed of a plurality of unit cells and a peripheral region provided outside the cell array region to drive and control the unit cells. Active elements such as Metal Oxide Semiconductor Field Emission Transistors (MOSFETs), diodes or bipolar junction transistors are formed to implement various circuits in the peripheral region.

SUMMARY OF THE INVENTION

Examples of embodiments of the invention may provide semiconductor devices having active elements and methods of fabricating the same.

According to some embodiments of the present invention, a semiconductor device may have active elements in different circuit regions. The semiconductor device may include a semiconductor substrate having a first circuit region and a second circuit region. A well region is provided in the semiconductor substrate of the second circuit region. A first semiconductor region may be positioned in the semiconductor substrate of the first circuit region and may have a different conductivity type from the semiconductor substrate of the first circuit region. A second semiconductor region may be positioned in the well region and may have a different conductivity type from the well region. An insulating isolation layer is provided to surround sidewalls of the first and second semiconductor regions. A bottom interlayer insulating layer is provided to cover the first and second semiconductor regions and the isolation layer. A first element hole penetrating the bottom interlayer insulating layer and exposing the first semiconductor region, and a second element hole exposing the second semiconductor region are provided. A first bottom semiconductor pattern, and a first top semiconductor pattern having a different conductivity type from the first semiconductor region are provided which are vertically arranged within the first element hole. A second bottom semiconductor pattern and a second top semiconductor pattern having a different conductivity type from the second semiconductor region are provided which are vertically arranged within the second element hole. An active element structure having the well region, the second semiconductor region, the second bottom semiconductor pattern and the second top semiconductor pattern is provided.

In some examples of embodiments of the present invention, the first bottom semiconductor pattern may have the same conductivity type as the first semiconductor region or the first top semiconductor pattern and have an impurity concentration lower than the first semiconductor region and the first top semiconductor pattern, and the second bottom semiconductor pattern may have the same conductivity type as the second semiconductor region or the second top semiconductor pattern and have an impurity concentration lower than the second semiconductor region and the second top semiconductor pattern.

In other examples of embodiments, a second diode element having the second semiconductor region, the second bottom semiconductor pattern and the second top semiconductor pattern may be provided in the active element structure.

In still other examples of embodiments, a vertical bipolar junction transistor element having the well region, the second semiconductor region, the second bottom semiconductor pattern and the second top semiconductor pattern may be provided in the active element structure.

In yet other examples of embodiments, the semiconductor device may further include a top interlayer insulating layer covering the bottom interlayer insulating layer, the first top semiconductor pattern and the second top semiconductor pattern. A base plug may penetrate the top and bottom interlayer insulating layers and may be electrically connected to the second semiconductor region. A first plug may penetrate the top interlayer insulating layer and may be electrically connected to the second top semiconductor pattern. A second plug may penetrate the top and bottom interlayer insulating layers and may be electrically connected to the well region.

The semiconductor device may further include a peripheral impurity region provided in the well region below the second plug, having the same conductivity type as the well region and having a peripheral impurity concentration higher than the well region. The peripheral impurity region may be spaced apart from the second semiconductor region by the isolation layer, and the isolation layer may have a bottom surface higher than a bottom surface of the well region.

In yet other examples of embodiments, the first semiconductor region, the first bottom semiconductor pattern and the first top semiconductor pattern in the semiconductor substrate of the first circuit region may constitute a cell switching element structure of a memory device in the first circuit region.

According to other embodiments of the present invention, a semiconductor device may have active elements using one semiconductor region in common. The semiconductor device may include a semiconductor region which is provided in a predetermined region of a semiconductor substrate having an active element region and may have a different conductivity type from the semiconductor substrate. An insulating isolation layer is provided to surround sidewalls of the semiconductor region. A bottom interlayer insulating layer is provided on the semiconductor substrate having the semiconductor region and the isolation layer. A first element hole and a second element hole are provided, which penetrate the bottom interlayer insulating layer, expose the semiconductor region and are spaced apart from each other. A first bottom semiconductor pattern and a first top semiconductor pattern are vertically arranged within the first element hole. A second bottom semiconductor pattern and a second top semiconductor pattern are vertically arranged within the second element hole. Here, the first and second top semiconductor patterns have the same conductivity type.

In some examples of embodiments, the first and second top semiconductor patterns may have a different conductivity type from the semiconductor region.

In other examples of embodiments, the first and second bottom semiconductor patterns may have the same conductivity type as or a different conductivity type from the semiconductor region and have an impurity concentration lower than the semiconductor region and the first and second top semiconductor patterns.

In still other examples of embodiments, the first and second holes may have the same width.

In yet other examples of embodiments, the first and second holes may have different widths from each other.

In yet other examples of embodiments, the semiconductor device may further include a first diode element and a second diode element using the semiconductor region in common. Here, the semiconductor region, the first bottom semiconductor pattern and the first top semiconductor pattern may constitute the first diode element, and the semiconductor region, the second bottom semiconductor pattern and the second top semiconductor pattern may constitute the second diode element.

In yet other examples of embodiments, the first top semiconductor pattern, the first bottom semiconductor pattern, the semiconductor region, the second bottom semiconductor pattern and the second top semiconductor pattern may constitute a bipolar junction transistor element, the first top semiconductor pattern may be an emitter of the bipolar junction transistor, and the second top semiconductor pattern may be a collector of the bipolar junction transistor.

In yet other examples of embodiments, the semiconductor device may further include a first bipolar junction transistor element and a second bipolar junction transistor element. The first top semiconductor pattern, the first bottom semiconductor pattern, the semiconductor region and the semiconductor substrate adjacent to the semiconductor region may constitute the first bipolar junction transistor element. The second top semiconductor pattern, the second bottom semiconductor pattern, the semiconductor region and the semiconductor substrate adjacent to the semiconductor region may constitute the second bipolar junction transistor element. The first and second bipolar junction transistors may use the semiconductor region and the semiconductor substrate adjacent to the semiconductor region in common.

In yet other examples of embodiments, the semiconductor device may further include a cell array region provided in the semiconductor substrate and spaced apart from the active element region. A cell semiconductor region may be provided in the semiconductor substrate of the cell array region, having a different conductivity type from the semiconductor substrate of the cell array region and whose sidewalls are surrounded by the isolation layer. A cell element hole may penetrate the interlayer insulating layer and may expose the cell semiconductor region. A cell bottom semiconductor pattern and a cell top semiconductor pattern may be vertically arranged within the cell element hole. Here, the cell top semiconductor pattern and the cell semiconductor region may have different conductivity types from each other, and the cell top semiconductor pattern, the cell bottom semiconductor pattern and the cell semiconductor region may constitute a cell switching element structure of a memory device.

According to still other embodiments of the present invention, a semiconductor device may have a bipolar junction transistor whose junctions between regions having different conductivity types from each other are vertically arranged. The semiconductor device may include a first semiconductor region provided in a semiconductor substrate. A second semiconductor region is provided within the first semiconductor region and has a different conductivity type from the first semiconductor region. An isolation layer is provided in the first semiconductor region and surrounds sidewalls of the second semiconductor region. A bottom interlayer insulating layer is provided, which covers the isolation layer and the first and second semiconductor regions. An element hole is provided which penetrates the bottom interlayer insulating layer and exposes the second semiconductor region. A bottom semiconductor pattern, and a top semiconductor pattern having a different conductivity type from the second semiconductor region which are vertically arranged are provided within the element hole. The top semiconductor pattern, the bottom semiconductor pattern, the first semiconductor region and the second semiconductor region constitute a vertical bipolar junction transistor element.

In some example embodiments, the bottom semiconductor pattern may have the same conductivity type as the second semiconductor region or the top semiconductor pattern and have an impurity concentration lower than the second semiconductor region and the top semiconductor pattern.

In other examples of embodiments, the semiconductor device may further include a peripheral impurity region provided within the first semiconductor region and spaced apart from the second semiconductor region. Here, the peripheral impurity region may have the same conductivity type as the first semiconductor region and may have an impurity concentration higher than the first semiconductor region.

According to yet other embodiments of the present invention, a method of fabricating a semiconductor device having active elements using one semiconductor region in common may be provided. The method includes implanting impurities having a different conductivity type from a semiconductor substrate into a predetermined region of the semiconductor substrate with an active element region to form a semiconductor region. A bottom interlayer insulating layer is formed on the semiconductor substrate having the semiconductor region. A first element hole and a second element hole are formed which penetrate the bottom interlayer insulating layer to expose the semiconductor region and are spaced apart from each other. A first bottom semiconductor pattern and a first top semiconductor pattern are formed which are vertically arranged within the first element hole, and a second bottom semiconductor pattern and a second top semiconductor pattern are formed which are vertically arranged within the second element hole. Here, the first and second top semiconductor patterns have the same conductivity type.

In some examples of embodiments, the first and second element holes may be formed to have the same width.

In other examples of embodiments, the first and second element holes may be formed to have different widths from each other.

According to still more embodiments of the present invention, a method of fabricating a semiconductor device having active elements formed in different circuit regions may be provided. The method includes preparing a semiconductor substrate having a first circuit region and a second circuit region. A well region is formed in the semiconductor substrate of the second circuit region. A first semiconductor region having a different conductivity type from the semiconductor substrate of the first circuit region is formed in the semiconductor substrate of the first circuit region. A second semiconductor region having a different conductivity type from the well region is formed in a predetermined region of the well region. A bottom interlayer insulating layer is formed on the semiconductor substrate having the first and second semiconductor regions. A first element hole penetrating the bottom interlayer insulating layer to expose the first semiconductor region, and a second element hole penetrating the bottom interlayer insulating layer to expose the second semiconductor region are formed. A first bottom semiconductor pattern and a first top semiconductor pattern having a different conductivity type from the first semiconductor region which are vertically arranged within the first element hole are formed, and a second bottom semiconductor pattern and a second top semiconductor pattern having a different conductivity type from the second semiconductor region which are vertically arranged within the second element hole are formed. An active element structure having the well region, the second semiconductor region, the second bottom semiconductor pattern and the second top semiconductor pattern is formed in the second circuit region.

In some examples of embodiments, the active element structure may include a vertical bipolar junction transistor element.

In other examples of embodiments, the method may further include forming an impurity region having the same conductivity type as the well region and having an impurity concentration higher than the well region within the well region. The impurity region may be spaced apart from the second semiconductor region.

BRIEF DESCRIPTION OF THE DRAWINGS

The foregoing and other features and advantages of the invention will become apparent from the following more particular description of examples of embodiments of the invention, as illustrated in the accompanying drawings. The drawings are not necessarily to scale, emphasis instead being placed upon illustrating the principles of embodiments of the invention.

FIG. 1 is a plan view of a semiconductor device according to examples of embodiments of the present invention.

FIGS. 2A, 2B, 3A, 3B, 4A, 4B, 5A, 5B, 6A and 6B are cross-sectional views of a semiconductor device according to examples of embodiments of the present invention.

DETAILED DESCRIPTION

Figure 2A:
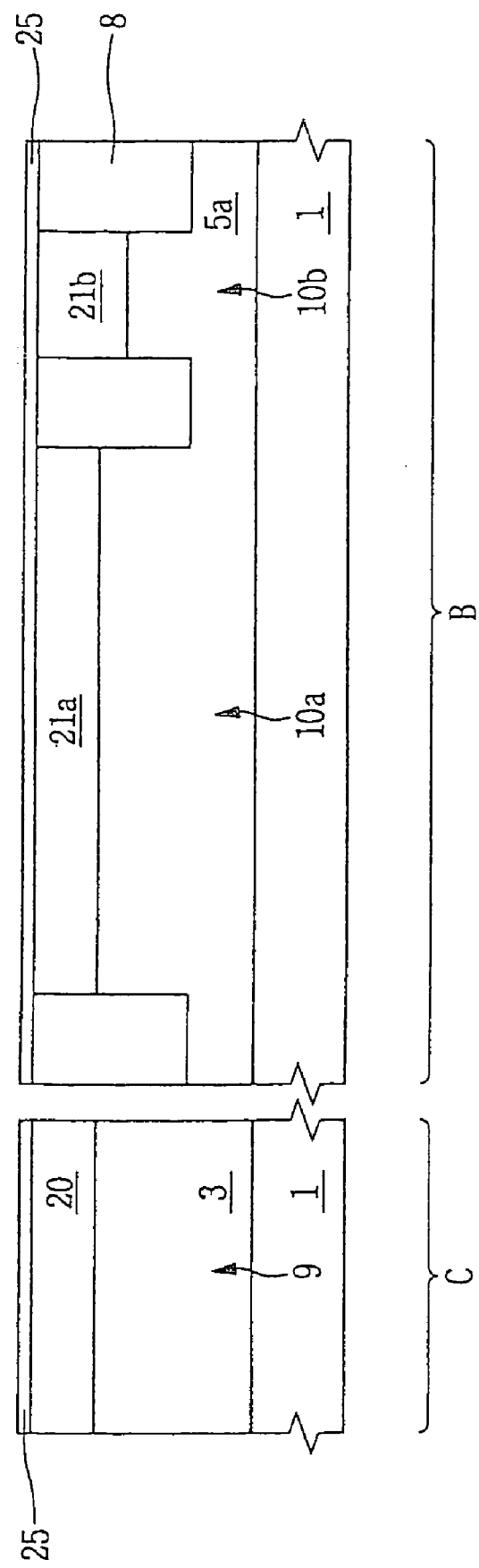

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a plan view of a semiconductor device according to some embodiments of the present invention, FIGS. 2A, 3A, 4A, 5A, and 6A are cross-sectional views taken along section line I-I' of FIG. 1, and FIGS. 2B, 3B, 4B, 5B and 6B are cross-sectional views taken along section line II-II' of FIG. 1.

Referring to FIGS. 1, 2A, 3A, 4A, 5A and 6A, reference symbol "C" denotes a first circuit region and reference symbol "B" denotes a second circuit region. Referring to FIGS. 1, 2B, 3B, 4B, 5B and 6B, reference symbol "D" denotes a third circuit region and reference symbol "E" denotes a fourth circuit region. Reference symbol "D1" denotes a first diode region and reference symbol "D2" denotes a second diode region in the third circuit region D.

A structure of a semiconductor device according to some embodiments of the present invention will now be described with reference to FIGS. 1, 6A and 6B.

Figure 6A:
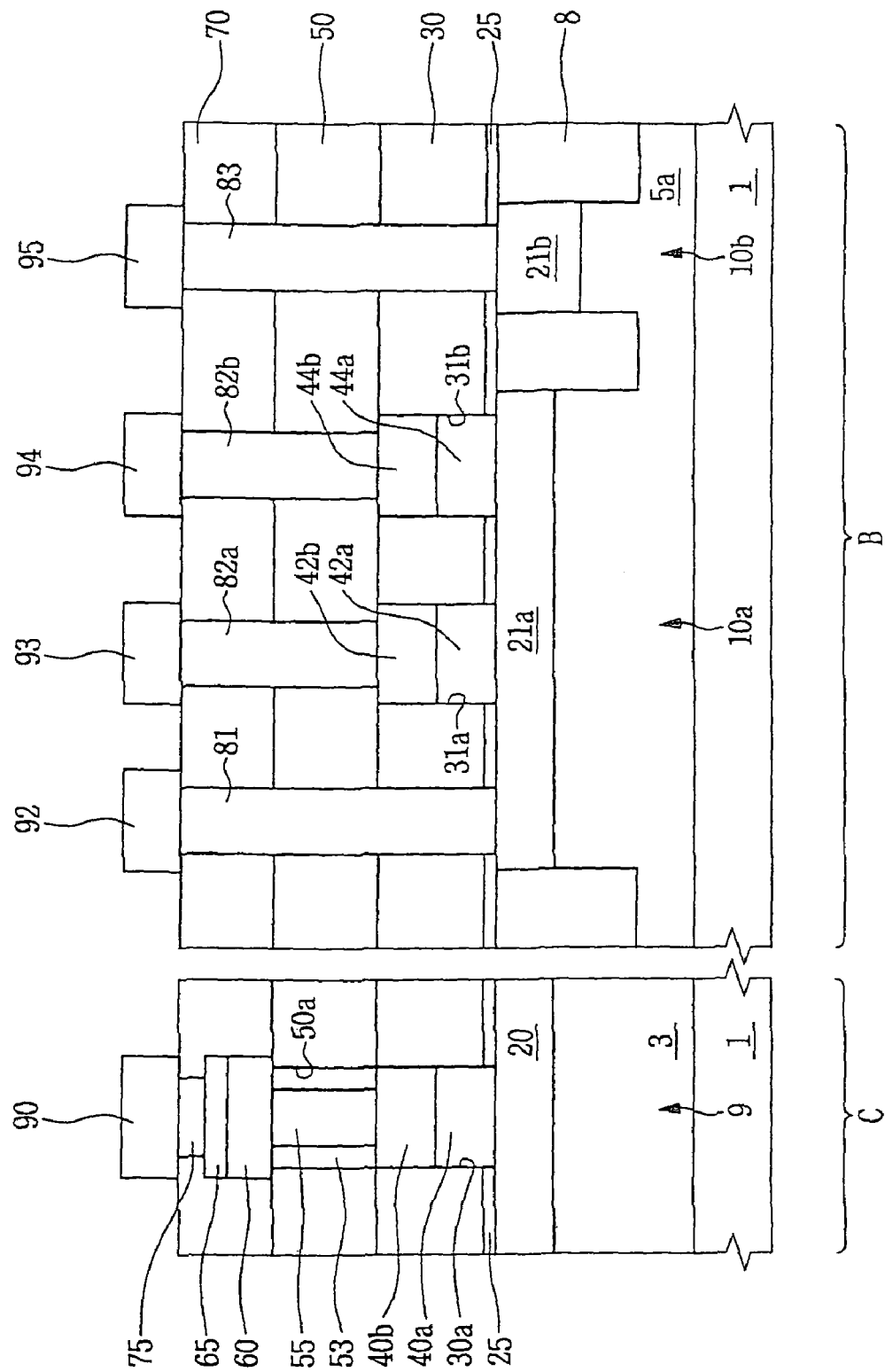
Figure 6B:
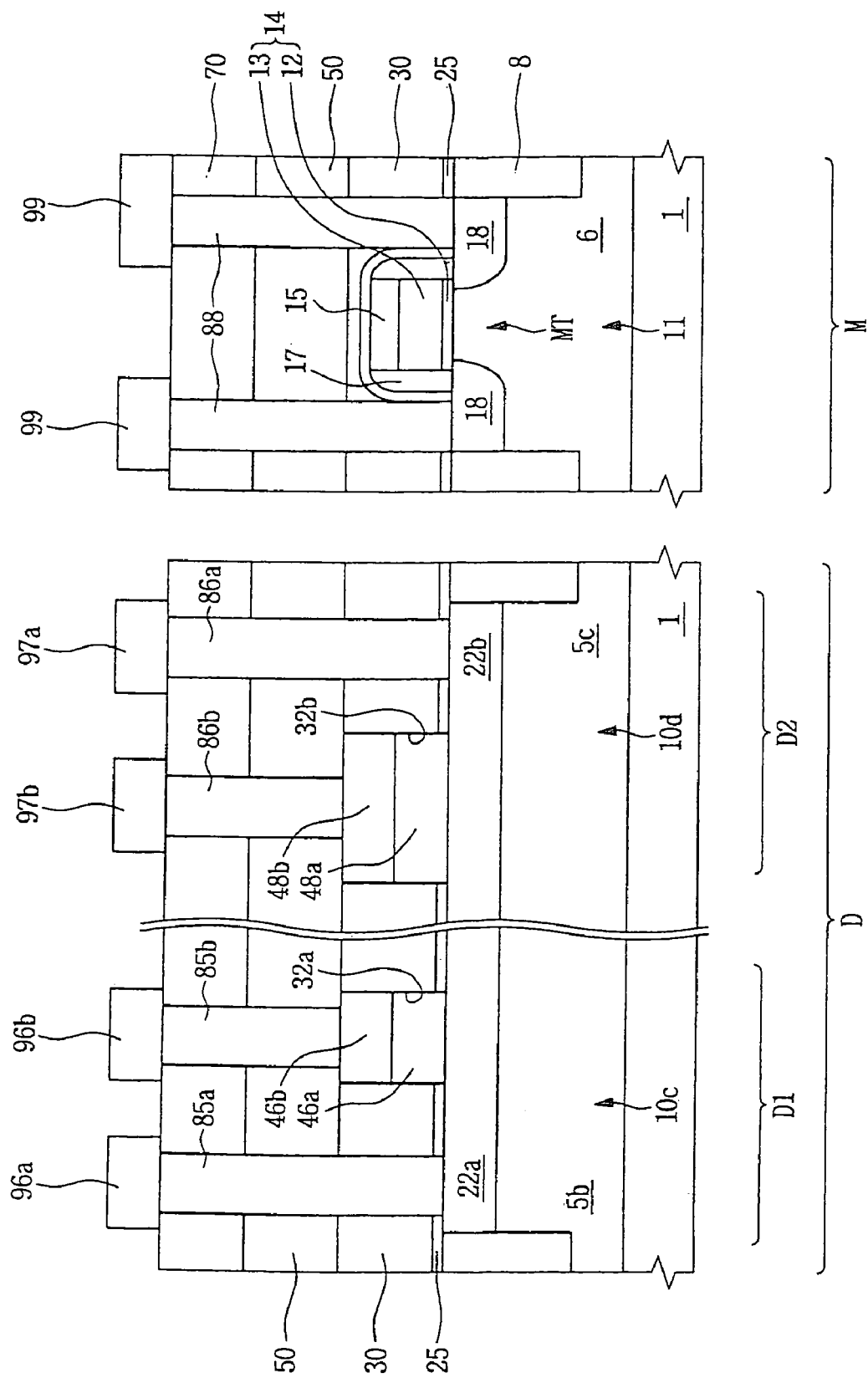

Referring to FIGS. 1, 6A and 6B, a semiconductor substrate 1 having a first circuit region C, a second circuit region B, a third circuit region D and a fourth circuit region M may be provided. The first circuit region C may be a memory cell array region, and the second to fourth circuit regions B, D and M may be peripheral circuit regions. Each of the second to fourth circuit regions B, D and M may be a circuit region including an active element. For example, the second circuit region B may include a bipolar junction transistor region, the third circuit region D may include a first diode region D1 and/or a second diode region D2, and the fourth circuit region M may include a MOSFET region. The semiconductor substrate 1 may be a silicon substrate, and/or the semiconductor substrate 1 may include a material such as silicon carbide (SiC), silicon germanium (SiGe), gallium arsenic (GaAs), etc.

A cell well region 3 may be provided in the semiconductor substrate 1 of the first circuit region C, and a first peripheral well region 5a may be provided in the semiconductor substrate 1 of the second circuit region B. A second peripheral well region 5b may be provided in the semiconductor substrate 1 of the first diode region D1 of the third circuit region C, a third peripheral well region 5c may be provided in the semiconductor substrate 1 of the second diode region D2 of the third circuit region C, and a fourth peripheral well region 6 may be provided in the semiconductor substrate 1 of the fourth circuit region M.

Any region of the cell well region 3, the first peripheral well region 5a, the second peripheral well region 5b, the third peripheral well region 5c and the fourth peripheral well region 6 may be omitted when it has the same conductivity type and the same impurity concentration as the semiconductor substrate 1.

An isolation layer 8 may be provided in the well regions 3, 5a, 5b, 5c and/or 6 of the semiconductor substrate 1 to define active regions. Specifically, the isolation layer 8 in the first circuit region C may define a cell active region 9, the isolation layer 8 in the second circuit region B may define a first peripheral active region 10a and a first peripheral terminal region 10b, the isolation layer 8 in the third circuit region D may define a second peripheral active region 10c and/or a third peripheral active region 10d, and the isolation layer 8 in the fourth circuit region M may define a fourth peripheral active region 11. The isolation layer 8 may be disposed higher than bottom surfaces of the well regions 3, 5a, 5b, 5c and 6. The isolation layer 8 may be a trench isolation layer.

A MOSFET MT may be provided on the fourth peripheral active region 11. Specifically, the MOSFET MT may include a gate pattern 14 disposed on the fourth peripheral active region 11 and source and drain regions 18 disposed in the fourth peripheral active region 11 at both sides of the gate pattern 14. The gate pattern 14 may include a gate dielectric layer 12 and a gate electrode 13 which are sequentially stacked. A capping mask 15 may be provided on the gate pattern 14. A gate spacer 17 may be provided on sidewalls of the gate pattern 14 and the capping mask 15. The MOSFET MT may include an N-type MOS (NMOS) transistor or a P-type MOS (PMOS) transistor. Such MOSFETs MT may be used to provide a complementary MOS (CMOS).

A cell semiconductor region 20 may be provided within the cell active region 9. Specifically, the cell semiconductor region 20 having a different conductivity type from the cell well region 3 may be provided within the cell well region 3 of the first circuit region C. A sidewall of the cell semiconductor region 20 may be surrounded by the isolation layer 8 of the first circuit region C.

A first peripheral semiconductor region 21a having a different conductivity type from the first peripheral well region 5a may be provided within the first peripheral active region 10a of the first peripheral well region 5a. In addition, a peripheral impurity region 21b having the same conductivity type as the first peripheral well region 5a may be provided within the first peripheral terminal region 10b of the first peripheral well region 5a. Here, the peripheral impurity region 21b may have a higher impurity concentration than the first peripheral well region 5a.

A second peripheral semiconductor region 22a having a different conductivity type from the second peripheral well region 5b may be provided within the second peripheral active region 10c in the second peripheral well region 5b, and a third peripheral semiconductor region 22b having a different conductivity type from the third peripheral well region 5c may be provided within the third peripheral active region 10d in the third peripheral well region 5c. Sidewalls of the second and third peripheral semiconductor regions 22a and 22b may be surrounded by the isolation layer 8 in the second peripheral circuit region D.

A passivation layer 25 may be provided to cover the isolation layer 8, the cell semiconductor region 30, the first to third peripheral semiconductor regions 21a, 22a and 22b, the peripheral impurity region 21b and the MOSFET MT. The passivation layer 25 may include an insulating material having an etch selectivity with respect to the isolation layer 8. For example, when the isolation layer 8 is formed of a silicon oxide layer, the passivation layer 25 may be formed of a silicon nitride layer. A bottom interlayer insulating layer 30 may be provided on the passivation layer 25.

In the first circuit region C, a cell diode hole 30a may be provided which penetrates the bottom interlayer insulating layer 30 and the passivation layer 25 and exposes a predetermined region of the cell semiconductor region 20. In the second circuit region B, one or more holes may be provided which penetrate the bottom interlayer insulating layer 30 and the passivation layer 25 and expose a predetermined region of the first peripheral semiconductor region 21a. For example, in the second circuit region B, a first peripheral element hole 31a and a second peripheral element hole 31b may be provided which penetrate the bottom interlayer insulating layer 30 and the passivation layer 25 and expose the first peripheral semiconductor region 21a. The first and second peripheral element holes 31a and 31b may be spaced apart from each other. The first and second peripheral element holes 31a and 31b may be disposed on the first peripheral semiconductor region 21a. The first and second peripheral element holes 31a and 31b may have the same width. Alternatively, the first and second peripheral element holes 31a and 31b may have different widths.

In the third circuit region D, a third peripheral element hole 32a penetrating the bottom interlayer insulating layer 30 and the passivation layer 25 and exposing a predetermined region of the second peripheral semiconductor region 22a, and a fourth peripheral element hole 32b penetrating the bottom interlayer insulating layer 30 and the passivation layer 25 and exposing a predetermined region of the third peripheral semiconductor region 22b may be provided. The third and fourth peripheral element holes 32a and 32b may have the same width. Alternatively, the third and fourth peripheral element holes 32a and 32b may have different widths. For example, the third peripheral element hole 32a may have a first width W1 and the fourth peripheral element hole 32b may have a second width W2 greater than or equal to the first width W1.

A bottom cell semiconductor pattern 40a and a top cell semiconductor pattern 40b may be vertically arranged within the cell diode hole 30a. The bottom cell semiconductor pattern 40a may have the same conductivity type as or a different conductivity type from the cell semiconductor region 20. The top cell semiconductor pattern 40a may have a different conductivity type from the cell semiconductor region 20. Accordingly, when the cell well region 3 has a P-type conductivity, the cell semiconductor region 20 may be have an N-type conductivity, the bottom cell semiconductor pattern 40a may have an N- or P-type conductivity, and the top cell semiconductor pattern 40b may have a P-type conductivity.

Even if the bottom cell semiconductor pattern 40a has any one conductivity type of the N and P-types, the bottom cell semiconductor pattern 40a may have an impurity concentration lower than the cell semiconductor region 20 and the top cell semiconductor pattern 40b.

When the bottom cell semiconductor pattern 40a has the same conductivity type as the cell semiconductor region 20, the bottom and top cell semiconductor patterns 40a and 40b which are vertically arranged within the cell diode hole 30a and have opposite conductivity types may constitute a cell diode. Alternatively, when the bottom cell semiconductor pattern 40a has a different conductivity type from the cell semiconductor region 20, the cell semiconductor region 20 and the bottom cell semiconductor pattern 40a in contact with the cell semiconductor region 20 may constitute a cell diode.

A first bottom peripheral semiconductor pattern 42a and a first top peripheral semiconductor pattern 42b may be vertically arranged within the first peripheral element hole 31a. The first bottom peripheral semiconductor pattern 42a may have the same conductivity type as or a different conductivity type from the first peripheral semiconductor region 21a. The first top peripheral semiconductor pattern 42b may have a different conductivity type from the first peripheral semiconductor region 21a.

Likewise, a second bottom peripheral semiconductor pattern 44a and a second top peripheral semiconductor pattern 44b may be vertically arranged within the second peripheral element hole 31b. That is, the second bottom peripheral semiconductor pattern 44a may have the same conductivity as type or a different conductivity type from the first peripheral semiconductor region 21a. The second top peripheral semiconductor pattern 44b may have a different conductivity type from the first peripheral semiconductor region 21a.

Even if the first and second bottom peripheral semiconductor patterns 42a and 44a are formed to have any one conductivity type of N and P-types, the first and second bottom peripheral semiconductor patterns 42a and 44a may have an impurity concentration lower than the first peripheral semiconductor region 21a and the first and second top peripheral semiconductor patterns 42b and 44b.

A third bottom peripheral semiconductor pattern 46a and a third top peripheral semiconductor pattern 46b may be vertically arranged within the third peripheral element hole 32a. The third bottom peripheral semiconductor pattern 46a may have the same conductivity type as or a different conductivity type from the second peripheral semiconductor region 22a.

The third top peripheral semiconductor pattern 46b may have a different conductivity type from the second peripheral semiconductor region 22a.

Even if the third bottom peripheral semiconductor pattern 46a is formed to have any one conductivity type of N and P-types, the third bottom peripheral semiconductor pattern 46a may have an impurity concentration lower than the second peripheral semiconductor region 22a and the third top peripheral semiconductor patterns 46b.

A fourth bottom peripheral semiconductor pattern 48a and a fourth top peripheral semiconductor pattern 48b may be vertically arranged within the fourth peripheral element hole 32b. The fourth bottom peripheral semiconductor pattern 48a may have the same conductivity type as or a different conductivity type from the third peripheral semiconductor region 22b. The fourth top peripheral semiconductor pattern 48b may have a different conductivity type from the third peripheral semiconductor region 22b.

Even if the fourth bottom peripheral semiconductor pattern 48a is formed to have any one conductivity type of N and P-types, the fourth bottom peripheral semiconductor pattern 48a may have an impurity concentration lower than the third peripheral semiconductor region 22b and the fourth top peripheral semiconductor patterns 48b.

An intermediate interlayer insulating layer 50 may be provided to cover the bottom interlayer insulating layer 30, the top cell semiconductor pattern 40b and the second to fourth top peripheral semiconductor patterns 42b, 44b, 46b and 48b. In the first circuit region C, a bottom electrode 55 may be provided which penetrates the intermediate interlayer insulating layer 50 and is electrically connected to the top cell semiconductor pattern 40b. The bottom electrode 55 may have a plane area smaller than a plane area of the top cell semiconductor pattern 40b. The bottom electrode 55 may include a titanium nitride layer or a titanium aluminum nitride layer. A metal silicide layer (not shown) may be provided between the bottom electrode 55 and the top cell semiconductor pattern 40b.

A data storage element 60 and a top electrode 65 may be provided on the bottom electrode 55. The data storage element 60 may include a phase-change material layer such as a chalcogenide layer. Accordingly, a memory device such as a phase-change RAM (PRAM) can be provided. However, the data storage element 60 is not limited to the phase-change material layer. As an example, the data storage element 60 may be formed of a resistive material layer other than the phase-change material layer described above. For example, the data storage element 60 may include a material such as a binary metal oxide layer. Accordingly, a memory device such as a resistance RAM (RRAM) can be provided. The top electrode 65 may include a material layer which does not react with the data storage element 60, e.g., a titanium nitride layer or a titanium aluminum nitride layer.

In other example embodiments, the bottom electrode 55 and the data storage element 60 may sequentially penetrate the intermediate interlayer insulating layer 50 to allow the data storage element 60 to have substantially the same top surface as the top surface of the intermediate interlayer insulating layer 50.

In still other example embodiments, the intermediate interlayer insulating layer 50 and the bottom interlayer insulating layer 30 may be a single insulating layer.

A top interlayer insulating layer 70 may be provided on the intermediate interlayer insulating layer 50 to cover the data storage element 60 and the top electrode 65. A bit line plug 75 may be provided which penetrates the top interlayer insulating layer 70 of the first circuit region C and which is electrically connected to the top electrode 65. A bit line 90 may be provided on the top interlayer insulating layer 70 of the first circuit region C to cover the bit line plug 75.

In the first circuit region C, a word line plug (not shown) which sequentially penetrates the top interlayer insulating layer 70, the intermediate interlayer insulating layer 50, the bottom interlayer insulating layer 30 and the passivation layer 25 and is electrically connected to the cell semiconductor region 20, and a metal word line (not shown) covering the word line plug may be provided.

In the second circuit region B, a first plug 81 for a first active element and a fourth plug 83 for the first active element may be provided which sequentially penetrate the top interlayer insulating layer 70, the intermediate interlayer insulating layer 50, the bottom interlayer insulating layer 30 and the passivation layer 25. Here, the first plug 81 may be electrically connected to the first peripheral semiconductor region 21*a* and the fourth plug 83 may be electrically connected to the peripheral impurity region 21*b*.

In the second circuit region B, a second plug 82*a* for the first active element and a third plug 82*b* for the first active element may be provided which sequentially penetrate the top interlayer insulating layer 70 and the intermediate interlayer insulating layer 50. Here, the second plug 82*a* may be electrically connected to the first top peripheral semiconductor pattern 42*b*, and the third plug 82*b* may be electrically connected to the second top peripheral semiconductor pattern 44*b*.

In the first diode region D1 of the third circuit region D, a first plug 85*a* for a second active element may be provided which sequentially penetrates the top interlayer insulating layer 70, the intermediate interlayer insulating layer 50, the bottom interlayer insulating layer 30 and the passivation layer 25 and is electrically connected to the second peripheral semiconductor region 22*a*. A second plug 85*b* for the second active element may be provided which sequentially penetrates the top interlayer insulating layer 70 and the intermediate interlayer insulating layer 50 and is electrically connected to the third top peripheral semiconductor pattern 46*b*.

In the second diode region D2 of the third circuit region D, a first plug 86*a* for a third active element may be provided which sequentially penetrates the top interlayer insulating layer 70, the intermediate interlayer insulating layer 50, the bottom interlayer insulating layer 30 and the passivation layer 25 and is electrically connected to the third peripheral semiconductor region 22*b*. A second plug 86*b* for the third active element may be provided which sequentially penetrates the top interlayer insulating layer 70 and the intermediate interlayer insulating layer 50 and is electrically connected to the fourth top peripheral semiconductor pattern 48*b*.

In the fourth circuit region M, source and drain plugs 88 may be provided which sequentially penetrate the top interlayer insulating layer 70, the intermediate interlayer insulating layer 50, the bottom interlayer insulating layer 30 and the passivation layer 25 and are electrically connected to the source and drain regions 18. Although not shown in the drawings, a gate plug may be provided which sequentially penetrates the top interlayer insulating layer 70, the intermediate interlayer insulating layer 50, the bottom interlayer insulating layer 30, the passivation layer 25 and the capping mask 15 and is electrically connected to the gate electrode 13.

A first interconnection 92 for the first active element covering the first plug 81, a second interconnection 93 for the first active element covering the second plug 82*a*, a third interconnection 94 for the first active element covering the third plug 82*b*, and a fourth interconnection 95 for the first active element covering the fourth plug 83 may be provided on the top interlayer insulating layer 70 of the second circuit region B. A first interconnection 96*a* for the second active element covering the first plug 85*a*, a second interconnection 96*b* for the second active element covering the second plug 85*b*, a first interconnection 97*a* for the third active element covering the first plug 86*a*, and a second interconnection 97*b* for the third active element covering the second plug 86*b* may be provided on the top interlayer insulating layer 70 of the third circuit region D. In the fourth circuit region M, source and drain interconnections 99 covering the source and drain plugs 88 may be provided on the top interlayer insulating layer 70.

When the first circuit region C is a cell array region of a semiconductor device such as a phase-change memory device, the cell semiconductor region 20 and the bottom and top cell semiconductor patterns 40*a* and 40*b* may provide a cell switching element structure. That is, the first circuit region C may be defined as the memory cell array region, and the cell diode mentioned above may be used as a cell-switching element in the first circuit region C.

In the second circuit region B, a peripheral active element structure may be provided which includes the first peripheral well region 5*a*, the first peripheral semiconductor region 21*a*, the first bottom peripheral semiconductor region 42*a*, the first top peripheral semiconductor region 42*b* and the peripheral impurity region 21*b*. For example, if the first peripheral well region 5*a* is a first conductivity type, the first peripheral semiconductor region 21*a* is a second conductivity type different from the first conductivity type, the peripheral impurity region 21*b* is the first conductivity type, the first bottom peripheral semiconductor pattern 42*a* is the first or second conductivity type and the first top peripheral semiconductor pattern 42*b* is the first conductivity type, the peripheral active element structure of the second circuit region B may constitute a vertical bipolar junction transistor such as a PNP transistor or an NPN transistor. The vertical bipolar junction transistor may be defined herein as a transistor whose junction between an emitter and a base and junction between the base and a collector are vertically arranged. The first peripheral semiconductor region 21*a* may be defined as a base region of the NPN or PNP transistor. For example, the first top peripheral semiconductor pattern 42*b* may be formed of a high-concentration P-type semiconductor region, the first bottom peripheral semiconductor pattern 42*a* may be formed of a low-concentration P or N-type semiconductor region, the first peripheral semiconductor region 21*a* may be formed of an N-type semiconductor region, and the peripheral impurity region 21*b* may be formed of a high-concentration P-type semiconductor region. As a result, a PNP transistor can be provided.

Likewise, in the second circuit region B, another peripheral active element structure may be provided which includes the first peripheral well region 5*a*, the first peripheral semiconductor region 21*a*, the second bottom peripheral semiconductor region 44*a*, the second top peripheral semiconductor region 44*b* and the peripheral impurity region 21*b*. For example, the second top peripheral semiconductor pattern 44*b* may be defined as a high-concentration P-type semiconductor region, the second bottom peripheral semiconductor pattern 44*a* may be formed of a low-concentration P or N-type semiconductor region, the first peripheral semiconductor region 21*a* may be formed of an N-type semiconductor region, and the peripheral impurity region 21*b* may be formed of a high-concentration P-type semiconductor region, and thus another PNP transistor may be provided in the second circuit region B.

As such, a plurality of active element structures using the first peripheral semiconductor region 21*a*, the first peripheral well region 5a and the peripheral impurity region 21b in common, that is, bipolar junction transistors, may be provided in the second circuit region B.

The first peripheral semiconductor region 21a may have the same conductivity type and impurity concentration as the cell semiconductor region 20. Alternatively, the first peripheral semiconductor region 21a and the cell semiconductor region 20 may have the same conductivity type as and different impurity concentrations from each other. For example, the first peripheral semiconductor region 21a may have a lower impurity concentration than the cell semiconductor region 20.

In the bipolar junction transistors, a junction area between a base and any one of a collector and an emitter has a size corresponding to plane areas of the first and second peripheral element holes 31a and 31b. It is already described that the first and second peripheral element holes 31a and 31b may have different widths from each other. Accordingly, a plurality of active element structures using the first peripheral semiconductor region 21a, the first peripheral well region 5a and the peripheral impurity region 21b in common and having different electrical properties from each other, that is, bipolar junction transistors, may be provided in the second circuit region B.

In the second circuit region B, a bipolar junction transistor such as an NPN or PNP transistor may be provided which uses the first top peripheral semiconductor pattern 42b as an emitter, the second top peripheral semiconductor pattern 44b as a collector and the first peripheral semiconductor region 21a as a base. Therefore, according to embodiments of FIGS. 6A and 6B, various circuits having an NPN transistor structure and/or a PNP transistor structure may be provided.

In the first peripheral diode region D1 of the third circuit region D, still another active element structure may be provided which includes the second peripheral well region 5b, the second peripheral semiconductor region 22a, the third bottom peripheral semiconductor region 46a and the third top peripheral semiconductor region 46b. For example, if the third top peripheral semiconductor pattern 46b is formed of a high-concentration P-type semiconductor region, the third bottom peripheral semiconductor pattern 46a is formed of a low-concentration P or N-type semiconductor region, the second peripheral semiconductor region 22a is formed of an N-type semiconductor region and the second peripheral well region 5b is formed of a low-concentration P-type semiconductor region, a first peripheral diode having a junction surface of a first width W1 can be provided. Since the second peripheral well region 5b has a different conductivity type from the second peripheral semiconductor region 22a, the second peripheral well region 5b can act to block leakage current in the active element structure of the first peripheral diode region D1.

Likewise, in the second peripheral diode region D2 of the third circuit region D, yet another active element structure may be provided which includes the third peripheral well region 5c, the third peripheral semiconductor region 22b, the fourth bottom peripheral semiconductor region 48a and the fourth top peripheral semiconductor region 48b. For example, if the fourth top peripheral semiconductor pattern 48b is formed of a high-concentration P-type semiconductor region, the fourth bottom peripheral semiconductor pattern 48a is formed of a low-concentration P or N-type semiconductor region, the third peripheral semiconductor region 22b is formed of an N-type semiconductor region and the fourth peripheral well region 5c is formed of a low-concentration P-type semiconductor region, a second peripheral diode having a junction surface of a second width W2 greater than the first width W1 can be provided. Here, since the third peripheral well region 5c has a different conductivity type from the third peripheral semiconductor region 22b, the third peripheral well region can act to block leakage current in the active element structure of the second peripheral diode region D2. Since components constituting the first and second peripheral diodes are vertically arranged, the first and second peripheral diodes may be defined as vertical diodes.

The third and fourth peripheral element holes 32a and 32b may have different widths W1 and W2 from each other. Accordingly, the first peripheral diode in the first peripheral diode region D1 including the third bottom and top peripheral semiconductor patterns 46a and 46b defined within the third peripheral element hole 32a, and the second peripheral diode in the second peripheral diode region D2 including the fourth bottom and top peripheral semiconductor patterns 48a and 48b defined within the fourth peripheral element hole 32b may have different electrical properties from each other. As such, according to embodiments of FIGS. 6A and 6B, vertical diodes having junction surfaces of different areas from each other may be provided in the diode region D. When the temperature changes, rates of current flowing through the diodes having different junction areas from each other may be different from each other. Such a property may be used to implement various semiconductor circuits.

The junction areas of the active elements formed according to embodiments of the present invention may correspond to widths of the first to fourth peripheral element holes 31a, 31b, 32a and 32b. Therefore, the active elements (e.g., diodes and/or bipolar junction transistors) according to embodiments of FIGS. 6A and 6B may be formed to have constant junction areas corresponding to the widths of the first to fourth peripheral element holes 31a, 31b, 32a and 32b compared to general active elements (e.g., diodes and/or bipolar junction transistors) formed by implanting different impurity ions from a well region into the well region. Therefore, reliable active elements may be provided.

As described above, a vertical diode may be used as a cell-switching element in the first circuit region C. Diodes and bipolar junction transistors may be provided in the second and third circuit regions B and D. In addition, diodes and the bipolar junction transistors in the second and third circuit regions B and D may be formed using substantially the same semiconductor process used to form the cell diode providing a cell switching element in the first circuit region C, and the diodes and/or transistors so formed may be employed in various semiconductor circuits. For example, the diodes and the bipolar junction transistors provided in the second and third circuit regions B and D may be used to provide temperature compensation circuit. It is also possible to configure various semiconductor circuits using passive elements and/or MOSFET elements in addition to the active elements described herein. In this case, the passive element may be a resistance element, and the MOSFET element may include at least one of CMOS, NMOS and/or PMOS.

Methods of fabricating semiconductor device structures according to embodiments of the present invention will now be described with reference to FIGS. 1, 2A, 2B, 3A, 3B, 4A, 4B, 5A, 5B, 6A and 6B.

Referring to FIGS. 1, 2A and 2B, a semiconductor substrate 1 having a first circuit region C, a second circuit region B, a third circuit region D and a fourth circuit region M may be prepared. The semiconductor substrate 1 may be a silicon substrate, and/or the semiconductor substrate 1 may include a material such as silicon carbide (SiC), silicon germanium (SiGe), and/or gallium arsenic (GaAs). The first circuit region C may be a memory cell array region, and the second to fourth circuit regions B, D and M may be peripheral circuit regions.

Each of the second to fourth circuit regions B, D and M may be a circuit region including an active element. For example, the second circuit region B may include a bipolar junction transistor region, the third circuit region D may include a first diode region D1 and/or a second diode region D2, and the fourth circuit region M may include a MOSFET region.

A cell well region 3 may be formed in the semiconductor substrate 1 of the first circuit region C. A first peripheral well region 5a may be formed in the semiconductor substrate 1 of the second circuit region B. A second peripheral well region 5b may be formed in the semiconductor substrate 1 of the first diode region D1 of the third circuit region C, and a third peripheral well region 5c may be formed in the semiconductor substrate 1 of the second diode region D2 of the third circuit region C. A fourth peripheral well region 6 may be formed in the semiconductor substrate 1 of the fourth circuit region M.

An isolation layer 8 may be formed in the well regions 3, 5a, 5b, 5c and 6 of the semiconductor substrate 1 to define active regions. Specifically, the isolation layer 8 in the first circuit region C may define a cell active region 9, the isolation layer 8 in the second circuit region B may define a first peripheral active region 10a and a first peripheral terminal region 10b, the isolation layer 8 in the third circuit region D may define a second peripheral active region 10c and/or a third peripheral active region 10d, and the isolation layer 8 in the fourth circuit region M may define a fourth peripheral active region 1. The isolation layer 8 may be formed higher than bottom surfaces of the well regions 3, 5a, 5b, 5c and 6. The isolation layer 8 may be formed using a shallow trench isolation technique.

In embodiments of FIGS. 1 and 2A-2B, an order of forming the well regions 3, 5a, 5b, 5c and 6 is not particularly limited. For example, the well regions 3, 5a, 5b, 5c and 6 may be formed to have proper conductivity types and proper impurity concentrations in consideration of properties of elements to be formed in the first to fourth circuit regions C, B, D and M of the semiconductor substrate 1. At this time, any region of the well regions 3, 5a, 5b, 5c and 6 which has the same conductivity type and impurity concentration as the semiconductor substrate 1 may be omitted.

A MOSFET MT may be formed on the fourth peripheral active region 11. Specifically, forming the MOSFET MT may include forming a gate pattern 14 and a capping mask 15 which are sequentially stacked on the fourth peripheral active region 11 of the fourth circuit region M, and forming source and drain regions 18 in the fourth peripheral active region 11 at both sides of the gate pattern 14. A gate spacer 17 may be formed on sidewalls of the gate pattern 14 and the capping mask 15 which are sequentially stacked.

A cell semiconductor region 20 may be formed within the cell active region 9. Specifically, impurity ions having a different conductivity type from the cell well region 3 may be implanted into the cell well region 3 of the first circuit region C to form the cell semiconductor region 20. Sidewalls of the cell semiconductor region 20 may be surrounded by the isolation layer 8 of the first circuit region C.

Impurity ions having a different conductivity type from the first peripheral well region 5a may be implanted into the first peripheral active region 10a of the first peripheral well region 5a to form a first peripheral semiconductor region 21a. In addition, impurity ions having the same conductivity type as the first peripheral well region 5a may be implanted into the first peripheral terminal region 10b of the first peripheral well region 5a to form a peripheral impurity region 21b. Here, the peripheral impurity region 21b may have an impurity concentration higher than the first peripheral well region 5a.

Impurity ions having a different conductivity type from the second peripheral well region 5b may be implanted into the second peripheral active region 10c of the second peripheral well region 5b to form a second peripheral semiconductor region 22a. Likewise, impurity ions having a different conductivity type from the third peripheral well region 5c may be implanted into the third peripheral active region 10d of the third peripheral well region 5c to form a third peripheral semiconductor region 22b. Sidewalls of the second and third peripheral semiconductor regions 22a and 22b may be surrounded by the isolation layer 8 in the second peripheral circuit region D.

In embodiments of FIGS. 1 and 2A-2B, an order of forming the cell semiconductor region 20, the first to third peripheral semiconductor regions 21a, 22a and 22b and the peripheral impurity region 21b is not particularly limited. For example, any regions of the cell semiconductor region 20, the first to third peripheral semiconductor regions 21a, 22a and 22b and the peripheral impurity region 21b may be formed by the same ion implantation process when the regions have the same conductivity type and impurity concentration. In other words, any regions of the cell semiconductor region 20, the first to third peripheral semiconductor regions 21a, 22a and 22b and the peripheral impurity region 21b may be formed by different ion implantation processes from each other when the regions have different conductivity types and impurity concentrations from each other. At this time, during the process for implanting the impurities into regions selected from the cell semiconductor region 20, the first to third peripheral semiconductor regions 21a, 22a and 22b and the peripheral impurity region 21b, regions other than the selected regions may be covered by an implantation mask such as a photoresist pattern mask, and this ion implantation mask may be removed after the ion implantation process is completed. For example, the first peripheral semiconductor region 21a and the peripheral impurity region 21b have different conductivity types from each other, and thus they may be formed by different ion implantation processes from each other.

An order of forming the cell semiconductor region 20, the first to third peripheral semiconductor regions 21a, 22a and 22b, the peripheral impurity region 21b and the isolation layer 8 is not particularly limited. For example, an epitaxial semiconductor layer may be grown on the semiconductor substrate 1, and the epitaxial semiconductor layer may be patterned to form a trench region defining epitaxial semiconductor patterns defining regions where the cell semiconductor region 20, the first to third peripheral semiconductor regions 21a, 22a and 22b and the peripheral impurity region 21b are to be formed. Then, an insulating layer filling the trench region may be formed to form the isolation layer 8, and proper impurity ions may be implanted into respective epitaxial semiconductor patterns to form the cell semiconductor region 20, the first to third peripheral semiconductor regions 21a, 22a and 22b and the peripheral impurity region 21b.

A passivation layer 25 may be formed to cover the isolation layer 8, the cell semiconductor region 30, the first to third peripheral semiconductor regions 21a, 22a and 22b, the peripheral impurity region 21b and the MOSFET MT. The passivation layer 25 may be formed of an insulating material having an etch selectivity with respect to the isolation layer 8. For example, when the isolation layer 8 is formed of a silicon oxide layer, the passivation layer 25 may be formed of a silicon nitride layer.

Figure 3A:
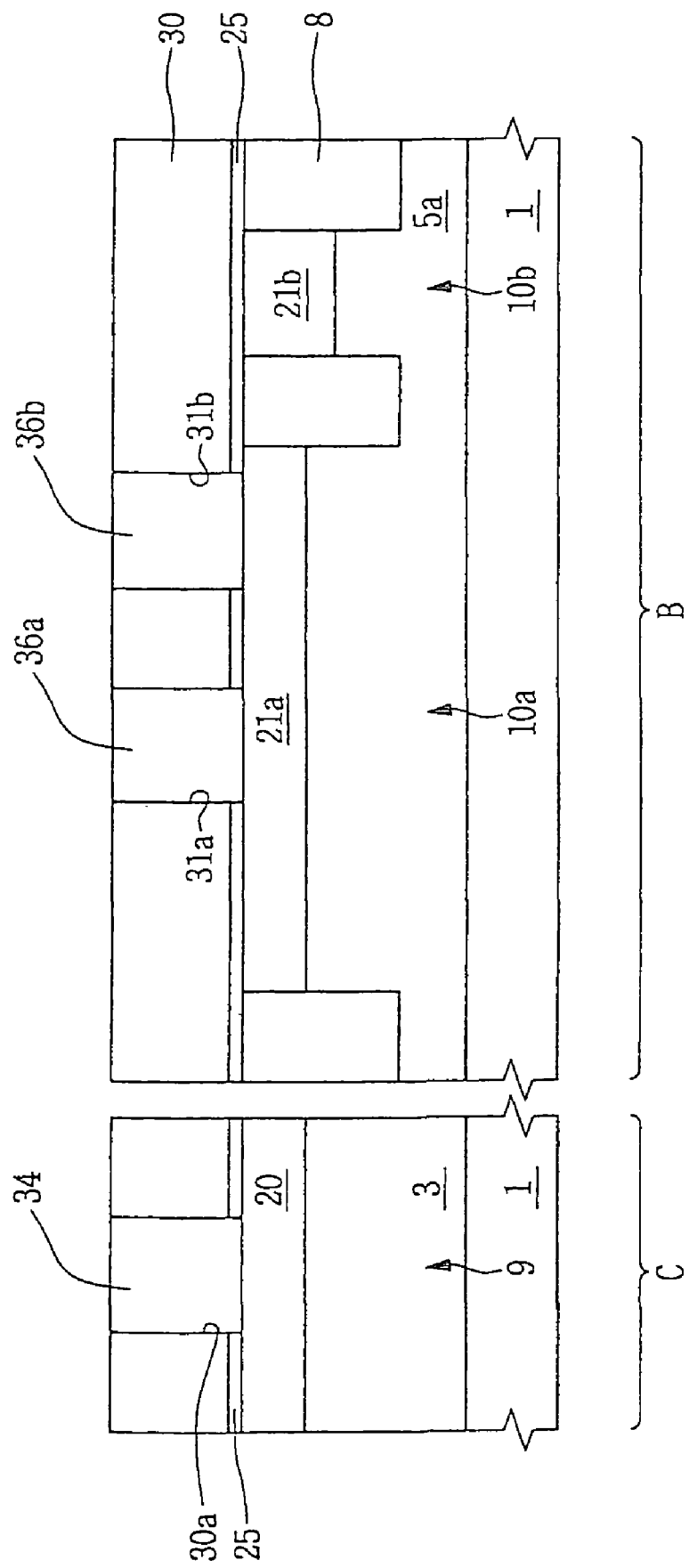

Referring to FIGS. 1, 3A and 3B, a bottom interlayer insulating layer 30 may be formed on the passivation layer 25. The bottom interlayer insulating layer 30 may be formed of an insulating material having an etch selectivity with respect to the passivation layer 25. For example, when the passivation layer 25 is formed of a silicon nitride layer, the bottom interlayer insulating layer 30 may be formed of a silicon oxide layer.

In the first circuit region C, a cell diode hole 30*a* may be formed which penetrates the bottom interlayer insulating layer 30 and the passivation layer 25 and exposes a predetermined region of the cell semiconductor region 20.

In the second circuit region B, one or more holes may be formed which penetrate the bottom interlayer insulating layer 30 and the passivation layer 25 and expose a predetermined region of the first peripheral semiconductor region 21*a*. For example, in the second circuit region B, a first peripheral element hole 31*a* and a second peripheral element hole 31*b* may be formed which penetrate the bottom interlayer insulating layer 30 and the passivation layer 25 and expose the first peripheral semiconductor region 21*a*. The first and second peripheral element holes 31*a* and 31*b* may be spaced apart from each other. The first and second peripheral element holes 31*a* and 31*b* may be disposed on the first peripheral semiconductor region 21*a*. In addition, the first peripheral element hole 31*a* may have a width greater than or equal to the second peripheral element hole 31*b*.

In the third circuit region D, a third peripheral element hole 32*a* which penetrates the bottom interlayer insulating layer 30 and the passivation layer 25 and exposes a predetermined region of the second peripheral semiconductor region 22*a*, and a fourth peripheral element hole 32*b* which penetrates the bottom interlayer insulating layer 30 and the passivation layer 25 and exposes a predetermined region of the third peripheral semiconductor region 22*b* may be formed. The third peripheral element hole 32*a* may have a first width W1, and the fourth peripheral element hole 32*b* may have a second width W2 greater than the first width W1. Alternatively, the third and fourth peripheral element holes 32*a* and 32*b* may have the same width.

A preliminary cell semiconductor pattern 34 may be formed within the cell diode hole 30*a*, a first preliminary peripheral semiconductor pattern 36*a* may be formed within the first peripheral element hole 31*a*, a second preliminary peripheral semiconductor pattern 36*b* may be formed within the second peripheral element hole 31*b*, a third preliminary peripheral semiconductor pattern 38*a* may be formed within the third peripheral element hole 32*a*, and a fourth preliminary peripheral semiconductor pattern 38*b* may be formed within the fourth peripheral element hole 32*b*.

The preliminary cell semiconductor pattern 34 may be formed by a selective epitaxial growth technique employing, as a seed layer, portions of the cell semiconductor region 20 exposed by the cell diode hole 30*a*. The first and second preliminary peripheral semiconductor patterns 36*a* and 36*b* may be formed by a selective epitaxial growth technique employing, as a seed layer, portions of the first peripheral semiconductor region 21*a* exposed by the first and second peripheral element holes 31*a* and 31*b*. The third and fourth preliminary peripheral semiconductor patterns 38*a* and 38*b* may be formed by a selective epitaxial growth technique employing, as a seed layer, portions of the second and third peripheral semiconductor region 22*a* and 22*b* exposed by the third and fourth peripheral element holes 32*a* and 32*b*. Accordingly, when the semiconductor substrate 1 has a single-crystalline semiconductor structure, the preliminary cell semiconductor pattern 34, the first and second preliminary peripheral semiconductor patterns 36*a* and 36*b*, and the third and fourth preliminary peripheral semiconductor patterns 38*a* and 38*b* may also have the single-crystalline semiconductor structure.

Forming the preliminary cell semiconductor pattern 34, the first and second preliminary peripheral semiconductor patterns 36*a* and 36*b*, and the third and fourth preliminary peripheral semiconductor patterns 38*a* and 38*b* may include forming a semiconductor layer that fills the cell diode hole 34, the first and second peripheral element holes 31*a* and 31*b* and the third and fourth peripheral element holes 32*a* and 32*b* and has a surface higher than the top surface of the bottom interlayer insulating layer 30 using a selective epitaxial growth technique, and planarizing the semiconductor layer. As a result, the preliminary cell semiconductor pattern 34, the first and second preliminary peripheral semiconductor patterns 36*a* and 36*b* and the third and fourth preliminary peripheral semiconductor patterns 38*a* and 38*b* may have the same flat surfaces as the top surface of the bottom interlayer insulating layer 30. When the selective epitaxial growth process is carried out using a silicon source gas, the preliminary cell semiconductor pattern 34, the first and second preliminary peripheral semiconductor patterns 36*a* and 36*b* and the third and fourth preliminary peripheral semiconductor patterns 38*a* and 38*b* may be formed of a silicon layer having a single-crystalline structure.

A semiconductor process such as Chemical Vapor Deposition (CVD) may be employed to form a non-single crystalline semiconductor layer, that is, an amorphous silicon layer or a polycrystalline silicon layer filling the cell diode hole 34, the first and second peripheral element holes 31*a* and 31*b* and the third and fourth peripheral element holes 32*a* and 32*b*, and the non-single crystalline semiconductor layer may be crystallized by a solid phase epitaxial (SPE) technique to form the preliminary cell semiconductor pattern 34, the first and second preliminary peripheral semiconductor patterns 36*a* and 36*b* and the third and fourth preliminary peripheral semiconductor patterns 38*a* and 38*b*. For example, the SPE technique may include annealing the non-single crystalline semiconductor layer to be crystallized at 500° C. or higher to provide substantially single crystal patterns.

Referring to FIGS. 1, 4A and 4B, impurity ions having the same conductivity type as or a different conductivity type from the cell semiconductor region 20 may be implanted into a lower region of the preliminary cell semiconductor pattern (34 of FIG. 3A) to form a bottom cell semiconductor pattern 40*a*. In addition, impurity ions having the same conductivity type as or a different conductivity type from the cell semiconductor region 20 may be implanted into an upper region of the preliminary cell semiconductor pattern (34 of FIG. 3A) to form a top cell semiconductor pattern 40*b*. When the cell well region is a P-type, the cell semiconductor region 20 may be an N-type, the bottom cell semiconductor pattern 40*a* may be an N or P-type, and the top cell semiconductor pattern 40*b* may be a P-type.

The ion implantation process for forming the bottom cell semiconductor pattern 40*a* may be performed after the ion implantation process for forming the top cell semiconductor pattern 40*b*.

Even if the bottom cell semiconductor pattern 40*a* is formed to have any one conductivity type of N and P-types, the bottom cell semiconductor pattern 40*a* may be doped to have an impurity concentration lower than the cell semiconductor region 20 and the top cell semiconductor pattern 40*b*.

When the bottom cell semiconductor pattern 40*a* is doped with impurity ions having the same conductivity type as the cell semiconductor region 20, the bottom and top cell semiconductor patterns 40a and 40b which are sequentially stacked within the cell diode hole 30a may constitute a cell diode. Alternatively, when the bottom cell semiconductor pattern 40a is doped with impurity ions having a different conductivity type from the cell semiconductor region 20, the cell semiconductor region 20 and the bottom cell semiconductor pattern 40a in contact with the cell semiconductor region 20 may constitute a cell diode.

Impurity ions having the same conductivity type as or a different conductivity type from the first peripheral semiconductor region 21a may be implanted into a lower region of the first preliminary peripheral semiconductor pattern (36a of FIG. 3A) by substantially the same method as the method of forming the bottom cell semiconductor patterns 40a to thereby form a first bottom peripheral semiconductor pattern 42a. In addition, impurity ions having a different conductivity type from the first peripheral semiconductor region 21a may be implanted into an upper region of the first preliminary peripheral semiconductor pattern (36a of FIG. 3A) by substantially the same method as the method of forming the top cell semiconductor patterns 40b to thereby form a first top peripheral semiconductor pattern 42b. Likewise, substantially the same method as the method of forming the first bottom peripheral semiconductor pattern 42a and the first top peripheral semiconductor pattern 42b may be employed to form a second bottom peripheral semiconductor pattern 44a and a second top peripheral semiconductor pattern 44b which are sequentially stacked within the second preliminary peripheral semiconductor pattern (36b of FIG. 3A). Even if the first and second bottom peripheral semiconductor patterns 42a and 44a are formed to have any one conductivity type of N and P-types, the first and second bottom peripheral semiconductor patterns 42a and 44a may be doped to have an impurity concentration lower than the first peripheral semiconductor region 21a and the first and second top peripheral semiconductor patterns 42b and 44b.

In addition, substantially the same method as the method of forming the first bottom peripheral semiconductor pattern 42a and the first top peripheral semiconductor pattern 42b may be employed to form a third bottom peripheral semiconductor pattern 46a and a third top peripheral semiconductor pattern 46b which are sequentially stacked within the third preliminary peripheral semiconductor pattern (38a of FIG. 3B). Accordingly, the third bottom peripheral semiconductor pattern 46a may have the same conductivity type as or a different conductivity type from the second peripheral semiconductor region 22a, and the third top peripheral semiconductor pattern 46b may have a different conductivity type from the second peripheral semiconductor region 22a. Even if the third bottom peripheral semiconductor pattern 46a is formed to have any one conductivity type of N and P-types, the third bottom peripheral semiconductor pattern 46a may be doped to have an impurity concentration lower than the second peripheral semiconductor region 22a and the third top peripheral semiconductor pattern 46b.

In addition, substantially the same method as the method of forming the first bottom peripheral semiconductor pattern 42a and the first top peripheral semiconductor pattern 42b may be employed to form a fourth bottom peripheral semiconductor pattern 48a and a fourth top peripheral semiconductor pattern 48b which are sequentially stacked within the fourth preliminary peripheral semiconductor pattern (38b of FIG. 3B). Accordingly, the fourth bottom peripheral semiconductor pattern 48a may have the same conductivity type as or a different conductivity type from the third peripheral semiconductor region 22b, and the fourth top peripheral semiconductor pattern 48b may have a different conductivity type from the third peripheral semiconductor region 22b.

Even if the fourth bottom peripheral semiconductor pattern 48a is formed to have any one conductivity type of N and P-types, the fourth bottom peripheral semiconductor pattern 48a may be doped to have an impurity concentration lower than the third peripheral semiconductor region 22b and the fourth top peripheral semiconductor pattern 48b.

Metal silicide layers (not shown) may be formed on the top cell semiconductor pattern 40b, and the top peripheral semiconductor patterns 42b, 44b, 46b and 48b. Specifically, a metal layer may be formed on the semiconductor substrate having the top cell semiconductor pattern 40b, and the top peripheral semiconductor patterns 42b, 44b, 46b and 48b, a silicidation annealing process may be carried out to form metal silicide layers on the top cell semiconductor pattern 40b, and the second to fourth top peripheral semiconductor patterns 42b, 44b, 46b and 48b, and a non-reacted metal layer may be removed.

Figure 5A:
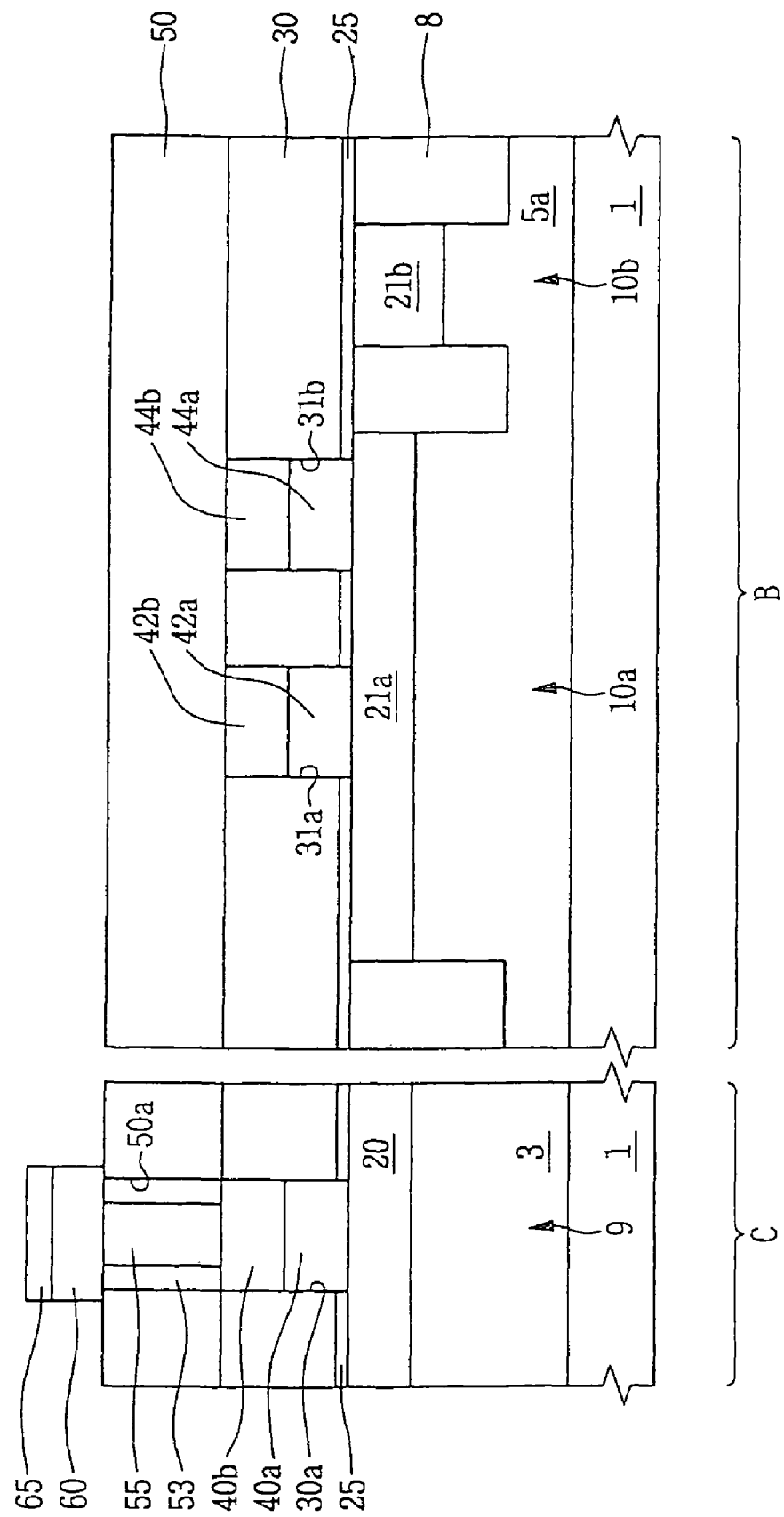
Figure 5B:
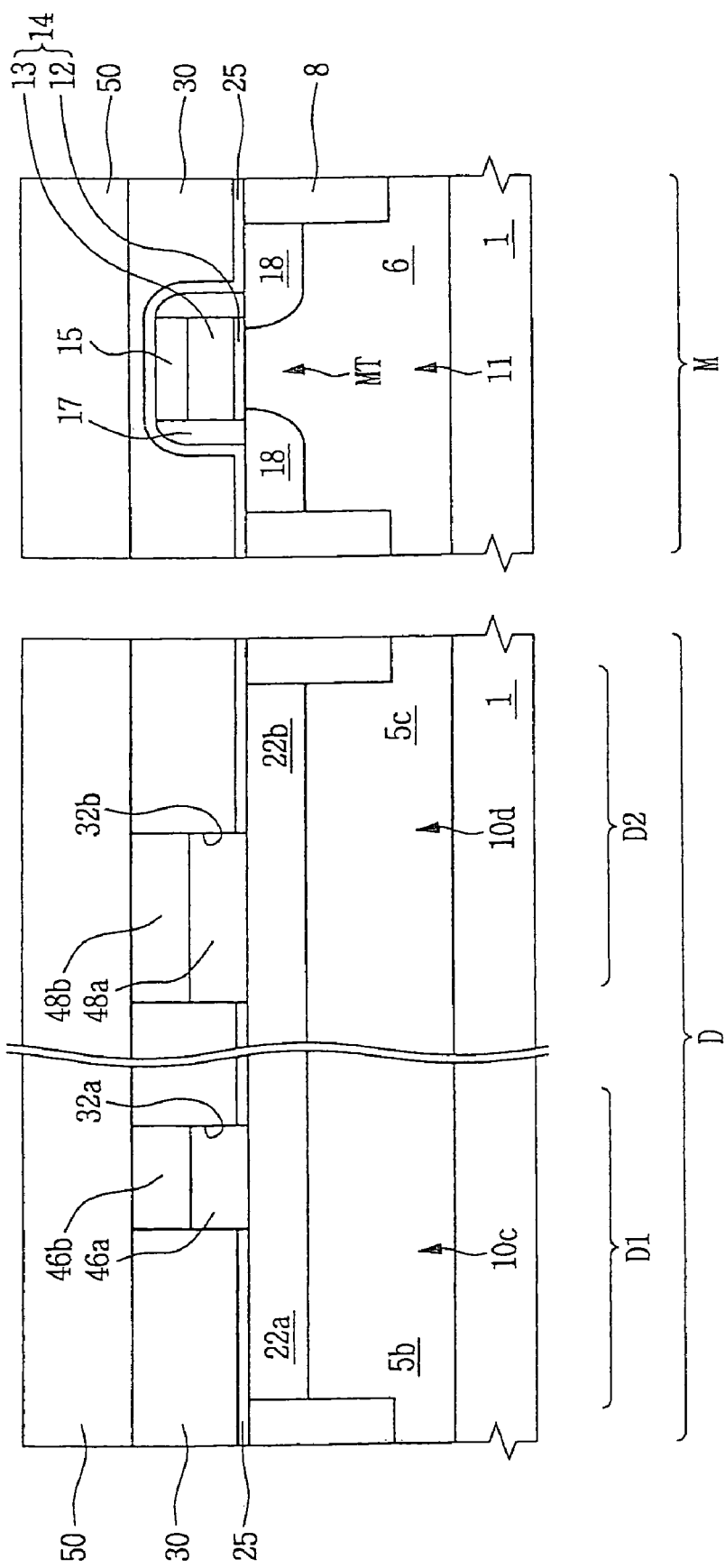

Referring to FIGS. 1, 5A and 5B, an intermediate interlayer insulating layer 50 may be formed to cover the interlayer insulating layer 30, the top cell semiconductor pattern 40b and the top peripheral semiconductor patterns 42a, 44b, 46b, 48b. The intermediate interlayer insulating layer 50 may be formed of a silicon oxide layer. The intermediate interlayer insulating layer 50 may be patterned to form a cell contact hole 50a exposing the top cell semiconductor pattern 40b. An insulating spacer 53 may be formed on sidewalls of the cell contact hole 50a. A bottom electrode 55 filling the cell contact hole 50a may be formed on the substrate having the insulating spacer 53 on sidewalls of the contact hole 50a. The bottom electrode 55 may be formed of a metal layer that does not react with a phase-change material layer to be formed in a subsequent process. For example, the bottom electrode 55 may be formed of a titanium nitride layer or a titanium aluminum nitride layer.

A data storage element 60 and a top electrode 65 may be formed on the bottom electrode 55. The data storage element 60 may be formed of a phase-change material layer such as a chalcogenide layer. However, the data storage element 60 is not limited to the phase-change material layer. For example, the data storage element 60 may be formed of a material such as a binary metal oxide layer. The top electrode 65 may be formed of a titanium nitride layer or a titanium aluminum nitride layer which does not react with the data storage element 60.

In other embodiments, the bottom electrode 55 may partially fill the contact hole 50a. Accordingly, the data storage element 60 or portions thereof may have a confined shape within the contact hole 50a.

Referring to FIGS. 1, 6A and 6B, a top interlayer insulating layer 70 covering the data storage element 60 and the top electrode 65 may be formed on the intermediate interlayer insulating layer 50. A bit line plug 75 may be formed which penetrates the top interlayer insulating layer 70 of the first circuit region C and is electrically connected to the top electrode 75. A bit line 90 covering the bit line plug 75 may be formed on the top interlayer insulating layer 70 of the first circuit region C. In the first circuit region C, a word line plug (not shown) may be formed which sequentially penetrates the top interlayer insulating layer 70, the intermediate interlayer insulating layer 50, the bottom interlayer insulating layer 30 and the passivation layer 25 and is electrically connected to the cell semiconductor region 20.

In the second circuit region B, a first plug 81 for a first active element and a fourth plug 83 for the first active element may be formed which sequentially penetrate the top interlayer insulating layer 70, the intermediate interlayer insulating layer 50, the bottom interlayer insulating layer 30 and the passivation layer 25. Here, the first plug 81 may be electrically connected to the first peripheral semiconductor region 21a, and the fourth plug 83 may be electrically connected to the peripheral impurity region 31b. In the second circuit region B, a second plug 82a for the first active element and a third plug 82b for the first active element may be formed which sequentially penetrate the top interlayer insulating layer 70 and the intermediate interlayer insulating layer 50. Here, the second plug 82a may be electrically connected to the first top peripheral semiconductor pattern 42b, and the third plug 82b may be electrically connected to the second top peripheral semiconductor pattern 44b.

In the first diode region D1 of the third circuit region D, a first plug 85a for a second active element which penetrates the top interlayer insulating layer 70, the intermediate interlayer insulating layer 50, the bottom interlayer insulating layer 30 and the passivation layer 25 and is electrically connected to the second peripheral semiconductor region 22a, and a second plug 85b for the second active element which sequentially penetrates the top interlayer insulating layer 70 and the intermediate interlayer insulating layer 50 and is electrically connected to the third top peripheral semiconductor pattern 46b may be formed.

In the second diode region D2 of the third circuit region D, a first plug 86a for a third active element which penetrates the top interlayer insulating layer 70, the intermediate interlayer insulating layer 50, the bottom interlayer insulating layer 30 and the passivation layer 25 and is electrically connected to the third peripheral semiconductor region 22b, and a second plug 86b for the third active element which sequentially penetrates the top interlayer insulating layer 70 and the intermediate interlayer insulating layer 50 and is electrically connected to the fourth top peripheral semiconductor pattern 48b may be formed.

In the fourth circuit region M, source and drain plugs 88 may be formed which sequentially penetrate the top interlayer insulating layer 70, the intermediate interlayer insulating layer 50, the bottom interlayer insulating layer 30 and the passivation layer 25 and are electrically connected to the source and drain regions 18. Although not shown in the drawings, a gate plug may be formed which sequentially penetrates the top interlayer insulating layer 70, the intermediate interlayer insulating layer 50, the bottom interlayer insulating layer 30, the passivation layer 25 and the capping mask 15 and is electrically connected to the gate electrode 13.

The plugs 81, 82a, 82b, 83, 85a, 85b, 86a, 86b and 88 described above may be formed using same semiconductor processes.

A first interconnection 92 for a first active element covering the first plug 81, a second interconnection 93 for the first active element covering the second plug 82a, a third interconnection 94 for the first active element covering the third plug 82b, and a fourth interconnection 95 for the first active element covering the fourth plug 83 may be formed on the top interlayer insulating layer 70 of the second circuit region B. A first interconnection 96a for a second active element covering the first plug 85a, a second interconnection 96b for the second active element covering the second plug 85b, a first interconnection 97a for a third active element covering the first plug 86a, and a second interconnection 97b for the third active element covering the second plug 86b may be formed on the top interlayer insulating layer 70 of the third circuit region D. In the fourth circuit region M, source and drain interconnections covering the source and drain plugs 88 may be formed on the top interlayer insulating layer 70. The interconnections 92, 93, 94, 95, 96a, 96b, 97a, 97b and 99 described above may be formed by the same semiconductor process.

According to some embodiments of the present invention, a plurality of active elements using one semiconductor region in common can be provided. In addition, vertical active elements can be provided in which constitutional elements constituting the active elements are vertically arranged. Further, a vertical bipolar junction transistor can be provided in which junction surfaces between regions having different conductivity types from each other are vertically arranged. Therefore, plane areas occupied by the active elements may be reduced, and thus a more highly integrated semiconductor circuit may be provided. In addition, a plurality of active elements having junction surfaces of different sizes from each other can be provided. Amounts of current flowing through such active elements may be different from each other, and thus the active elements having various electrical properties can be provided. Accordingly, a wide range of selecting the active elements can be achieved in the design of semiconductor circuits.

While the invention has been particularly shown and described with reference to examples of embodiments thereof, it will be understood by those of ordinary skill in the art that various changes in form and details may be made therein without departing from the spirit and scope of the present invention as defined by the following claims.

What is claimed is:

1. A semiconductor device comprising:
    a semiconductor substrate having first and second circuit regions at a surface thereof;
    a first semiconductor region in the first circuit region of the semiconductor substrate wherein a P-N junction is defined between the first semiconductor region and a bulk of the semiconductor substrate in the first circuit region;
    a well region in the second circuit region;
    a second semiconductor region in the well region of the second circuit region of the semiconductor substrate wherein a P-N junction is defined between the second semiconductor region and the well region;
    an insulating isolation structure in the semiconductor substrate wherein the insulating isolation structure surrounds sidewalls of the first and second semiconductor regions;
    an interlayer insulating layer on the first and second semiconductor regions and on the insulating isolation structure, wherein the interlayer insulating layer has a first element hole therethrough exposing a portion of the first semiconductor region and a second element hole therethrough exposing a portion of the second semiconductor region;
    a first semiconductor pattern in the first element hole on the exposed portion of the first semiconductor region wherein a P-N junction is defined between the first semiconductor region and a portion of the first semiconductor pattern;
    a second semiconductor pattern in the second element hole on the exposed portion of the second semiconductor region wherein a P-N junction is defined between the second semiconductor region and a portion of the second semiconductor pattern, wherein the well region, the second semiconductor region, and the second semiconductor pattern define portions of an active electronic element.

2. The semiconductor device according to claim 1 wherein a first portion of the first semiconductor pattern is between a second portion of the first semiconductor pattern and the first semiconductor region, and wherein the first portion of the first semiconductor pattern has an impurity concentration that is lower than an impurity concentration of the second portion of the first semiconductor pattern and that is lower than an impurity concentration of the first semiconductor region.

3. The semiconductor device according to claim 1 wherein a first portion of the first semiconductor pattern is between a second portion of the first semiconductor pattern and the first semiconductor region, wherein the first portion of the first semiconductor pattern and the first semiconductor region have the same conductivity type, and wherein the first and second portions of the first semiconductor pattern have different conductivity types.

4. The semiconductor device according to claim 1 wherein a first portion of the second semiconductor pattern is between a second portion of the second semiconductor pattern and the second semiconductor region, and wherein the first and second portions of the second semiconductor pattern have opposite conductivity types to define a diode of the active electronic element.

5. The semiconductor device according to claim 1 wherein the well region, the second semiconductor region, and the second semiconductor pattern define portions of a bipolar junction transistor.

6. The semiconductor device according to claim 1 wherein the interlayer insulating layer comprises a first interlayer insulating layer, the semiconductor device further comprising:
  a second interlayer insulating layer on the first interlayer insulating layer so that the first interlayer insulating layer is between the semiconductor substrate and the second interlayer insulating layer;
  a first conductive plug extending through the first and second interlayer insulating layers so that the first conductive plug is electrically connected to the second semiconductor region;
  a second conductive plug extending through the second interlayer insulating layer so that the second conductive plug is electrically connected to the second semiconductor pattern; and
  a third conductive plug extending through the first and second interlayer insulating layers so that the third conductive plug is electrically connected to the well region;
  wherein the active electronic element comprises a bipolar junction transistor, wherein the second semiconductor region defines a base of the bipolar junction transistor electrically coupled between the second semiconductor pattern and the well region.

7. The semiconductor device according to claim 6 further comprising:
  a peripheral impurity region in the well region adjacent the third conductive plug wherein the well region and the peripheral impurity region have a same conductivity type, wherein an impurity concentration of the peripheral impurity region is greater than an impurity concentration of the well region, wherein the peripheral impurity region and the second semiconductor region are separated by portions of the insulating isolation structure, and wherein a depth of the well region into the semiconductor substrate is greater than a depth of the insulating isolation structure into the semiconductor substrate.

8. The semiconductor device according to claim 1 further comprising:
  a memory storage element, wherein the first semiconductor pattern is electrically connected between the memory storage element and the first semiconductor region.

9. A semiconductor device comprising:
  a semiconductor region of a semiconductor substrate wherein a P-N junction is defined between the semiconductor region and a bulk of the semiconductor substrate;
  an insulating isolation structure in the semiconductor substrate wherein the insulating isolation structure surrounds sidewalls of the semiconductor region;
  an interlayer insulating layer on the semiconductor substrate, on the semiconductor region, and on the insulating isolation structure, wherein the interlayer insulating layer has first and second spaced apart element holes exposing respective first and second portions of the semiconductor region;
  a first semiconductor pattern in the first element hole on the first exposed portion of the semiconductor region; and
  a second semiconductor pattern in the second element hole on the second exposed portion of the semiconductor region;
  wherein a surface portion of the first semiconductor pattern opposite the semiconductor substrate and a surface portion of the second semiconductor pattern opposite the semiconductor substrate have a same conductivity type, wherein a first portion of the first semiconductor pattern is between a second portion of the first semiconductor pattern and the semiconductor region, wherein a first portion of the second semiconductor pattern is between a second portion of the second semiconductor pattern and the semiconductor region, and wherein the first portions of the first and second semiconductor patterns have an impurity concentration that is lower than an impurity concentration of the second portions of the first and second semiconductor patterns and that is lower than an impurity concentration of the semiconductor region.

10. The semiconductor device according to claim 9 wherein a first P-N junction is defined between the semiconductor region and a portion of the first semiconductor pattern, and wherein a second P-N junction is defined between the semiconductor region and a portion of the second semiconductor pattern.

11. The semiconductor device according to claim 9 wherein a first portion of the first semiconductor pattern is between a second portion of the first semiconductor pattern and the semiconductor region, wherein a first portion of the second semiconductor pattern is between a second portion of the second semiconductor pattern and the semiconductor region, wherein the first portions of the first and second semiconductor patterns and the semiconductor region have a same conductivity type, wherein the first and second portions of the first semiconductor pattern have different conductivity types, and wherein the first and second portions of the second semiconductor pattern have different conductivity types.

12. The semiconductor device according to claim 9 wherein the first and second element holes have different widths in a direction parallel with respect to a surface of the semiconductor substrate.

13. The semiconductor device according to claim 9 wherein a first P-N junction is defined between the semiconductor region and a portion of the first semiconductor pattern so that the semiconductor region and the first semiconductor pattern define a first diode element, and wherein a second P-N junction is defined between the semiconductor region and a portion of the second semiconductor pattern so that the semiconductor region and the second semiconductor pattern define a second diode element.

14. The semiconductor device according to claim 9 wherein the semiconductor region comprises an active element semiconductor region, the semiconductor device further comprising:
  a cell semiconductor region of the semiconductor substrate spaced apart from the active element semiconductor region, wherein a P-N junction is defined between the cell semiconductor region and a bulk of the semiconductor substrate, wherein the insulating isolation structure surrounds sidewalls of the semiconductor region, and wherein the interlayer insulating layer defines a cell element hole exposing a portion of the cell semiconductor region;
  a cell semiconductor pattern in the cell element hole on the exposed portion of the cell semiconductor region, wherein a first portion of the cell semiconductor pattern is between a second portion of the cell semiconductor pattern and the cell semiconductor region, and wherein a P-N junction is defined between the first and second portions of the cell semiconductor pattern; and
  a memory storage element, wherein the cell semiconductor pattern is electrically connected between the memory storage element and the cell semiconductor region.

15. A semiconductor device comprising:
  a semiconductor region of a semiconductor substrate wherein a P-N junction is defined between the semiconductor region and a bulk of the semiconductor substrate;
  an insulating isolation structure in the semiconductor substrate wherein the insulating isolation structure surrounds sidewalls of the semiconductor region;
  an interlayer insulating layer on the semiconductor substrate, on the semiconductor region, and on the insulating isolation structure, wherein the interlayer insulating layer has first and second spaced apart element holes exposing respective first and second portions of the semiconductor region;
  a first semiconductor pattern in the first element hole on the first exposed portion of the semiconductor region; and
  a second semiconductor pattern in the second element hole on the second exposed portion of the semiconductor region;
  wherein a surface portion of the first semiconductor pattern opposite the semiconductor substrate and a surface portion of the second semiconductor pattern opposite the semiconductor substrate have a same conductivity type, wherein the first and second semiconductor patterns and the semiconductor region define elements of a bipolar junction transistor, wherein a surface of the first semiconductor pattern opposite the semiconductor substrate defines an emitter of the bipolar junction transistor, wherein a surface of the second semiconductor pattern opposite the substrate defines a collector of the bipolar junction transistor, and wherein the semiconductor region defines a base of the bipolar junction transistor.

16. The semiconductor device according to claim 15 wherein a first portion of the first semiconductor pattern is between a second portion of the first semiconductor pattern and the semiconductor region, wherein a first portion of the second semiconductor pattern is between a second portion of the second semiconductor pattern and the semiconductor region, and wherein the first portions of the first and second semiconductor patterns have an impurity concentration that is lower than an impurity concentration of the second portions of the first and second semiconductor patterns and that is lower than an impurity concentration of the semiconductor region.

17. A semiconductor device comprising:
  a semiconductor region of a semiconductor substrate wherein a P-N junction is defined between the semiconductor region and a bulk of the semiconductor substrate;
  an insulating isolation structure in the semiconductor substrate wherein the insulating isolation structure surrounds sidewalls of the semiconductor region;
  an interlayer insulating layer on the semiconductor substrate, on the semiconductor region, and on the insulating isolation structure, wherein the interlayer insulating layer has first and second spaced apart element holes exposing respective first and second portions of the semiconductor region;
  a first semiconductor pattern in the first element hole on the first exposed portion of the semiconductor region; and
  a second semiconductor pattern in the second element hole on the second exposed portion of the semiconductor region;
  wherein a surface portion of the first semiconductor pattern opposite the semiconductor substrate and a surface portion of the second semiconductor pattern opposite the semiconductor substrate have a same conductivity type, wherein a surface of the first semiconductor pattern opposite the semiconductor substrate defines an emitter/collector of a first bipolar junction transistor, wherein a surface of the second semiconductor pattern opposite the semiconductor substrate defines an emitter/collector of a second bipolar junction transistor, and wherein the semiconductor region defines a shared base of the first and second bipolar junction transistors.

18. A semiconductor device comprising:
  a first semiconductor region in a semiconductor substrate;
  a second semiconductor region in the first semiconductor region wherein the first and second semiconductor regions have different conductivity types;
  an insulating isolation structure in the semiconductor substrate, wherein the insulating isolation structure surrounds sidewalls of the second semiconductor region, and wherein a depth of the first semiconductor region into the substrate is greater than a depth of the insulating isolation structure into the substrate;
  an interlayer insulating layer on the semiconductor substrate, on the first and second semiconductor regions, and on the insulating isolation structure wherein the interlayer insulating layer has an element hole therethrough exposing a portion of the second semiconductor region; and
  a semiconductor pattern in the element hole wherein a P-N junction is defined between the second semiconductor region and a portion of the semiconductor pattern in the element hole;
  wherein a surface of the semiconductor pattern opposite the substrate defines an emitter/collector of a bipolar junction transistor, and wherein the second semiconductor region defines a base of the bipolar junction transistor.

19. The semiconductor device according to claim 18 wherein a first portion of the semiconductor pattern is between a second portion of the semiconductor pattern and the second semiconductor region, and wherein an impurity concentration of the first portion of the semiconductor pattern is less than an impurity concentration of the second portion of the semiconductor pattern and less than an impurity concentration of the second semiconductor region.

20. The semiconductor device according to claim 19 further comprising:
a peripheral impurity region in the first semiconductor region and spaced apart from the second semiconductor region, wherein the peripheral impurity region and the first semiconductor region have a same conductivity type, and wherein an impurity concentration of the peripheral impurity region is greater than an impurity concentration of the first semiconductor region.

* * * * *